US006777976B2

(12) United States Patent
Kuge

(10) Patent No.: US 6,777,976 B2
(45) Date of Patent: Aug. 17, 2004

(54) INTERFACE CIRCUIT AND SEMICONDUCTOR DEVICE WITH THE SAME

(75) Inventor: Shigehiro Kuge, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/245,671

(22) Filed: Sep. 18, 2002

(65) Prior Publication Data

US 2003/0184343 A1 Oct. 2, 2003

(30) Foreign Application Priority Data

Mar. 27, 2002 (JP) ........................................ 2002-087672

(51) Int. Cl.[7] .................. H03K 19/0175; H03K 17/16
(52) U.S. Cl. ............................ 326/30; 326/85; 326/86; 327/109
(58) Field of Search .................. 326/30, 85, 86; 327/109

(56) References Cited

U.S. PATENT DOCUMENTS 5,955,894 A * 9/1999 Vishwanthaiah et al. ...... 326/86
6,026,456 A * 2/2000 Ilkbahar ...................... 710/100

FOREIGN PATENT DOCUMENTS

JP 11-85345 3/1999

OTHER PUBLICATIONS

Related U.S. application Ser. No. 09/749,509, filed Dec. 28, 2000 (Our Ref. No. 49657–901).

* cited by examiner

Primary Examiner—Daniel D. Chang
(74) Attorney, Agent, or Firm—McDermott Will & Emery LLP

(57) ABSTRACT

An output drive circuit is constructed by an output driving MOS transistor driving an output node in accordance with an internal read data, a termination controlling P-channel MOS transistor selectively rendered conductive in accordance with the internal read data when the output driving MOS transistor is non-conductive, and a P-channel MOS transistor rendered conductive to pull up the output node to a power supply voltage level at least when the output drive circuit is inactive. Data transfer is executed in an open drain manner, and the P-channel MOS transistor is utilized as a transistor for termination bus line. Data/signal is transferred fast in an active termination scheme with low current consumption, and an area occupied by the output drive circuit is reduced.

5 Claims, 26 Drawing Sheets

F I G. 1
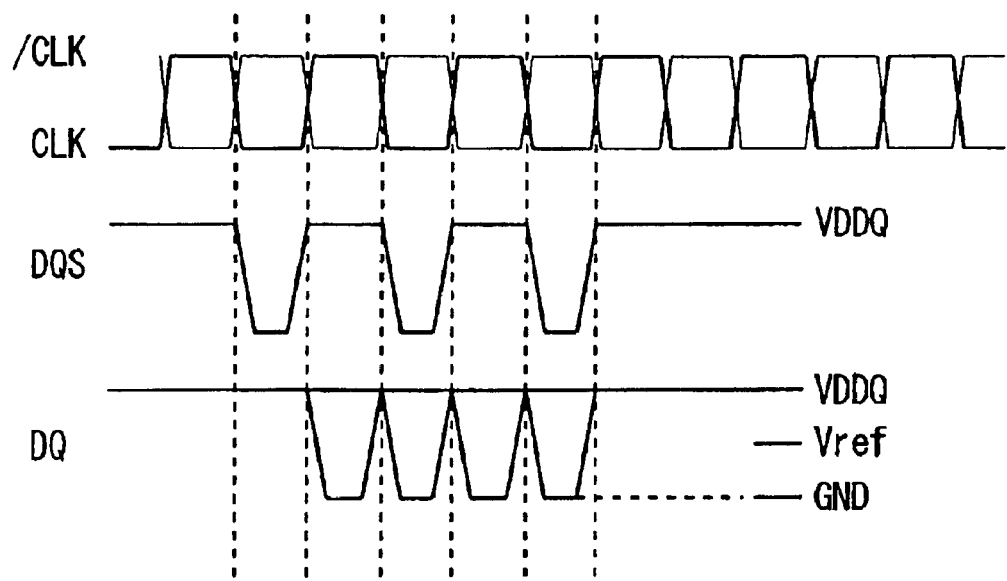
F I G. 2
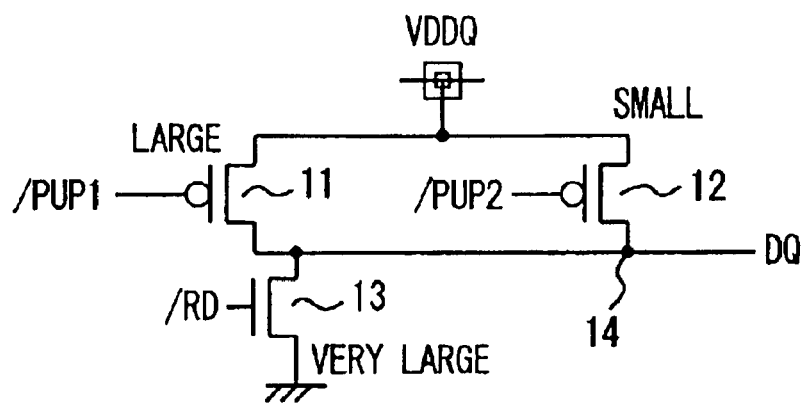

| | CH | MU1 | | MU2 | | MU3 | | MU4 | |
|---|---|---|---|---|---|---|---|---|---|
| | | L1 | R1 | L2 | R2 | L3 | R3 | L4 | R4 |
| 11 | OFF | OFF | OFF | OFF | OFF | OFF | OFF | OFF | OFF |
| 12 | ON | ON | ON | ON | ON | ON | ON | OFF* | OFF |
| 13 | OFF | OFF | OFF | OFF | OFF | OFF | OFF | OFF | ON |

"L" IS TRANSFERRED (R4 − CH).   * OR ON

| | CH | MU1 | | MU2 | | MU3 | | MU4 | |
|---|---|---|---|---|---|---|---|---|---|
| | | L1 | R1 | L2 | R2 | L3 | R3 | L4 | R4 |
| 11 | OFF | OFF | OFF | OFF | OFF | OFF | OFF | OFF | ON |
| 12 | ON | ON | ON | ON | ON | ON | ON | OFF* | OFF |
| 13 | OFF | OFF | OFF | OFF | OFF | OFF | OFF | OFF | OFF |

"H" IS TRANSFERRED (R4 − CH).   * OR ON

FIG. 9A

"L" IS TRANSFERRED (R4 − CH)

| CH | MU1 | | MU2 | | MU3 | | MU4 | |
|---|---|---|---|---|---|---|---|---|
| | L1 | R1 | L2 | R2 | L3 | R3 | L4 | R4 |
| 11 | ON | OFF | OFF | OFF | OFF | OFF | OFF | OFF |
| 12 | OFF | OFF | OFF | OFF | OFF | OFF | OFF | OFF |
| 13 | OFF | OFF | OFF | OFF | OFF | OFF | OFF | ON |

FIG. 9B

"H" IS TRANSFERRED (R4 − CH)

| CH | MU1 | | MU2 | | MU3 | | MU4 | |
|---|---|---|---|---|---|---|---|---|
| | L1 | R1 | L2 | R2 | L3 | R3 | L4 | R4 |
| 11 | ON | OFF | OFF | OFF | OFF | OFF | OFF | ON |
| 12 | OFF | OFF | OFF | OFF | OFF | OFF | OFF | OFF |
| 13 | OFF | OFF | OFF | OFF | OFF | OFF | OFF | OFF |

FIG. 10A

"L" IS TRANSFERRED (R4 − CH)

| CH | MU1 | | MU2 | | MU3 | | MU4 | |
|---|---|---|---|---|---|---|---|---|
| | L1 | R1 | L2 | R2 | L3 | R3 | L4 | R4 |
| 11 | OFF | OFF | OFF | OFF | OFF | OFF | OFF | OFF |
| 12 | ON | ON | ON | ON | ON | ON | OFF | OFF |
| 13 | OFF | OFF | OFF | OFF | OFF | OFF | OFF | ON |

FIG. 10B

"H" IS TRANSFERRED (R4 − CH)

| CH | MU1 | | MU2 | | MU3 | | MU4 | |
|---|---|---|---|---|---|---|---|---|
| | L1 | R1 | L2 | R2 | L3 | R3 | L4 | R4 |
| 11 | OFF | OFF | OFF | OFF | OFF | OFF | OFF | OFF |
| 12 | ON | ON | ON | ON | ON | ON | OFF | OFF |
| 13 | OFF | OFF | OFF | OFF | OFF | OFF | OFF | OFF |

FIG. 11A

"L" IS TRANSFERRED (R4 - CH)

| CH | MU1 | | MU2 | | MU3 | | MU4 | |
|---|---|---|---|---|---|---|---|---|
| | L1 | R1 | L2 | R2 | L3 | R3 | L4 | R4 |
| 11 | OFF | OFF | OFF | OFF | OFF | OFF | OFF | OFF |
| 12 | ON | ON | ON | ON | ON | ON | OFF | OFF |
| 13 | OFF | OFF | OFF | OFF | OFF | OFF | OFF | ON |

FIG. 11B

"H" IS TRANSFERRED (R4 - CH)

| CH | MU1 | | MU2 | | MU3 | | MU4 | |
|---|---|---|---|---|---|---|---|---|
| | L1 | R1 | L2 | R2 | L3 | R3 | L4 | R4 |
| 11 | OFF | OFF | OFF | OFF | OFF | OFF | OFF | ON |
| 12 | ON | ON | ON | ON | ON | ON | OFF | OFF |
| 13 | OFF | OFF | OFF | OFF | OFF | OFF | OFF | OFF |

F I G. 2 3
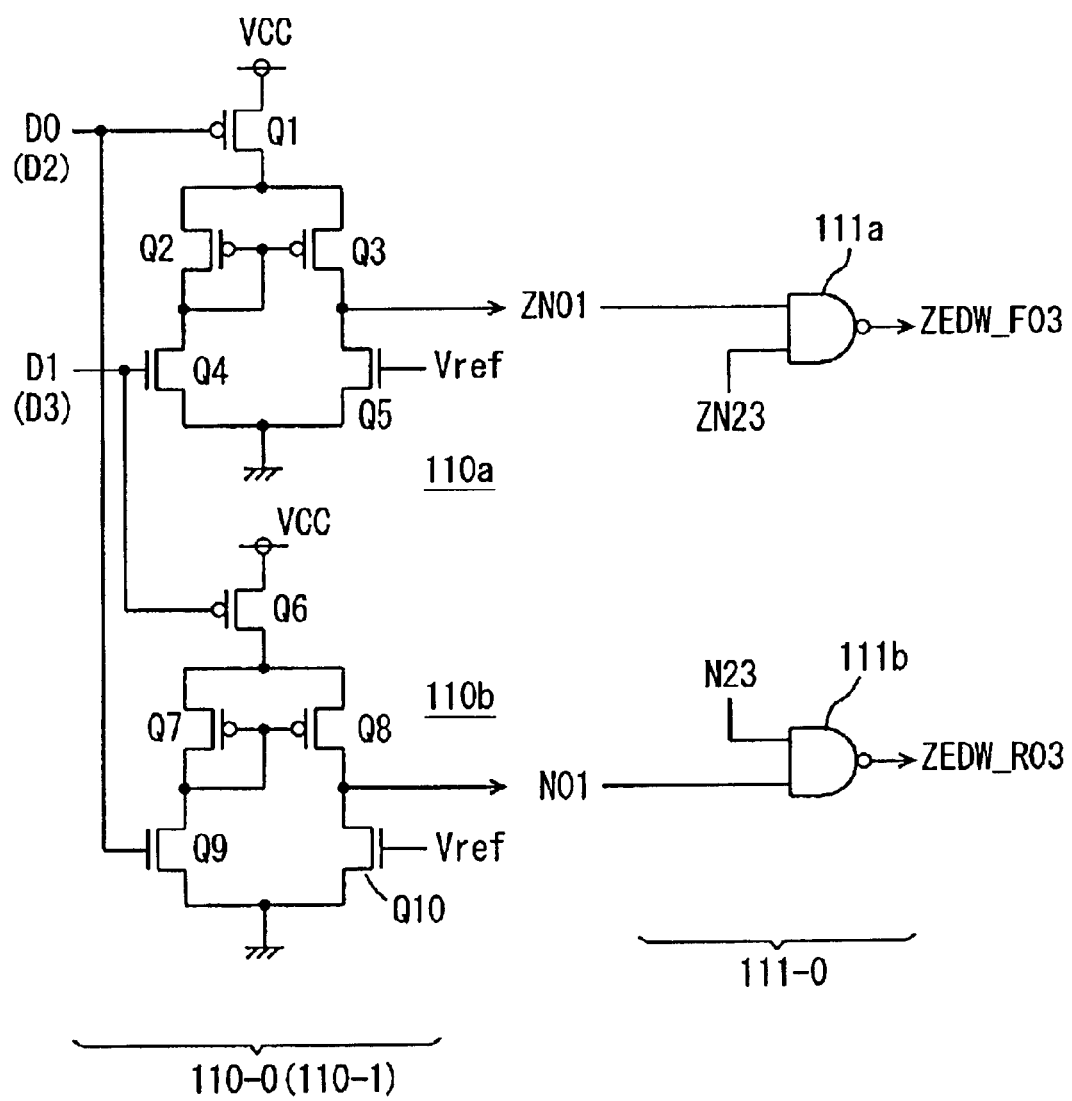

REGISTER A

REGISTER B

FIG. 47 PRIOR ART
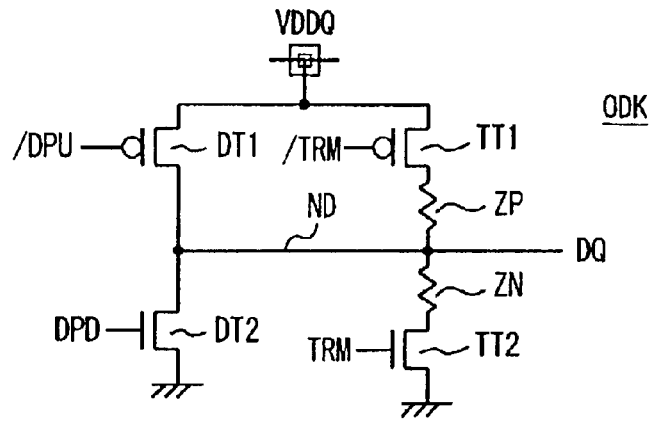
FIG. 48 PRIOR ART
|  | CHIP SET CH | MU1 | | MU2 | |
|---|---|---|---|---|---|
|  |  | L1 | R1 | L2 | R2 |
| DT1 | OFF | OFF | OFF | OFF | · |
| DT2 | OFF | OFF | OFF | OFF | · |
| TT1 | ON | ON | ON | OFF | OFF |
| TT2 | ON | ON | ON | OFF | OFF |
EITHER ONE IS ON
FIG. 49 PRIOR ART
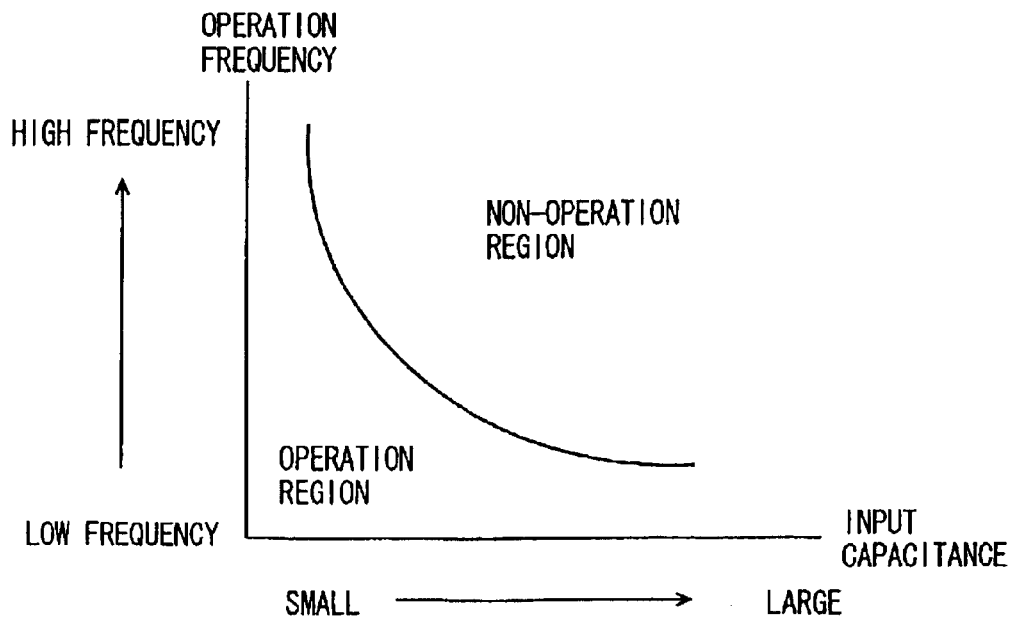

INTERFACE CIRCUIT AND SEMICONDUCTOR DEVICE WITH THE SAME

BACKGROUND OF THE INVENTION

1. Field of the Invention

The present invention relates to an interface circuit for transferring signals and/or data, and particularly to an interface circuit for driving a signal/data bus line terminated in accordance with an active termination scheme. More particularly, the present invention relates to an interface circuit for transferring data of a semiconductor memory device at high speed.

2. Description of the Background Art

With progress of a semiconductor technology in recent years, operation frequencies of semiconductor chips have been remarkably improved. At present, central processing units (CPUs) operating in a GHz (giga hertz) class are available. For constituting a system, it is necessary to assemble various semiconductor devices such as a CPU and a semiconductor memory device on a motherboard, and to connect these semiconductor devices together via on-board interconnection lines. The on-board interconnection lines (wires) have larger interconnection widths and larger parasitic capacitances than interconnection lines inside the chip. Also, an on-board parasitic capacitance is present. Therefore, fast transfer of signal/data is difficult. Accordingly, the signal/data transfer only at a rate of about 100 MHz or lower can be achieved at the motherboard level. For this reason, a DDR (Double Data Rate) mode has been generally and widely used. In the DDR mode, data/signal is transferred in synchronization with both rising and falling edges of a transfer clock signal so that the signal/data is transferred at a doubled rate of the transfer clock signal.

Even in the signal/data transfer scheme according to the DDR mode, it has been attempted to achieve faster data/signal transfer by increasing the transfer frequency.

FIG. 44 shows by way of example a structure of a conventional memory system. In FIG. 44, the memory system includes memory units MU1 and MU2 as well as a chip set CH performing data access to these memory units MU1 and MU2. A data bus DB includes data bus lines DDBL for transmitting data DQ0–DQ63 of 64 bits and a strobe signal line SDBL for transferring a data strobe signal DQS providing strobe timing of data at chip set CH.

Memory units MU1 and MU2 are alternatively activated to transfer data of 4 bits. In this memory system, therefore, further memory units are connected to data bus DB, for transferring data of 60 bits. For the sake of simplicity, FIG. 44 representatively shows memory units MU1 and MU2 transferring data DQ0–DQ3 of 4 bits.

Each of memory units MU1 and MU2 is formed of a DIMM (Dual Inline Memory Module), in which memory chips are mounted on front and rear surfaces of a module substrate. In FIG. 44, opposite sides of each module substrate are represented by left and right sides L and R, respectively. Memory unit MU1 includes memory chips ML1–MLn mounted on a left side L1 and memory chips MR1–MRn mounted on a right side R1. Likewise, memory unit MU2 includes memory chips ML1–MLn mounted on a left side L2 and memory chips MR1–MRn mounted on a right side R2. Each of memory chips ML1–MLn and MR1–MRn sends and receives 4-bit data DQ0–DQ3 and data strobe signal DQS when selected.

When memory unit MU1 or MU2 transfers data to chip set CH, data strobe signal DQS is transferred in synchronization with the data to chip set CH from the memory chip sending the data.

Each of bus lines DDBL and SDBL of data bus DB is terminated with a termination voltage Vtt. This termination voltage is at a level of voltage VDDQ/2 intermediate between a power supply voltage VDDQ and a ground voltage. This termination voltage Vtt is supplied from a dedicated power supply circuit on the motherboard.

FIG. 45 is a signal waveform diagram illustrating an operation of transferring data from a memory unit in the memory system to the chip set shown in FIG. 44. Memory units MU1 and MU2 transfer data DQ in synchronization with rising and falling edges of a clock signal CLK when selected. For detecting the rising and falling edges of clock signal CLK, complementary clock signals CLK and /CLK are used, and the detection of the clock signal edges is performed within memory units MU1 and MU2 based on crossing portions of complementary clock signals CLK and /CLK.

Each of bus lines DDBL and SDBL of data bus DB is kept at termination voltage Vtt through a termination resistance in a standby state. By transferring data DQ in synchronization with the rising and falling edges of clock signal CLK, it is possible to transfer data at a double rate as compared to the Single Data Rate (SDR) mode, in which data is transferred in synchronization with only the rising or falling edge of the clock signal. Such fast data transfer makes the conditions of set-up and hold times of data severer. Data strobe signal DQS is used for accurately sampling the data by chip set CH.

This data strobe signal DQS indicates a position of the clock signal, where the data transfer is performed. The memory unit transferring data once sets data strobe signal DQS to L level before the data transfer, and thereafter toggles it between H- and L levels in synchronization with the clock signal for transferring data DQ in synchronization with data strobe signal DQS. Since data bus DB is terminated at termination voltage Vtt, the data transferring chip (memory chip or chip set) drives the data bus to H- or L level.

The bus topology shown in FIG. 44 has been generally used in a memory system including a DDR-SDRAM (Double Data Rate Synchronous DRAM). However, in order to feed the termination voltage Vtt, a chip dedicated to production of termination voltage Vtt must be arranged on the motherboard. Also, a termination resistance must be arranged for supplying the termination voltage Vtt to each of bus lines DDBL and SDBL of data bus DB. This termination resistance is formed of a pure resistance of a high resistance, and a considerable area on the motherboard is required for arranging the termination resistance to each bus line.

For overcoming the disadvantages of the bus termination scheme described above, an active termination scheme has been proposed.

FIG. 46 schematically shows a conventional system structure of an active termination scheme. FIG. 46 representatively shows a structure of a portion related to data bus line DDBL of one bit.

In each of memory units Mu1 and MU2, internal memory chips include output drive circuits ODK. Output drive circuit ODK is arranged as a final output stage in each memory chip. Data bus line DDBL is not connected to a termination resistance.

Chip set CH includes an output drive circuit ODK for driving data bus line DDBL for transferring output data, a differential amplifier circuit AMP1 for amplifying a difference between a signal on data bus line DDBL and a reference voltage Vref, a differential amplifier circuit AMP2 for amplifying a difference between a strobe signal STR and reference voltage Vref, and a latch circuit LKT for latching an output signal of differential amplifier circuit AMP1 in response to an output signal of differential amplifier circuit AMP2.

Latch circuit LKT includes a first latch entering a latch state when the output signal of differential amplifier circuit AMP2 is at an H level (logical high level), and a second latch entering a latch state when the output signal of differential amplifier circuit AMP2 is at an L level (logical low level). These first and second latches commonly receive the output signal of differential amplifier circuit AMP1. These first and second latches alternately operate to take in and latch the data, which are transferred in synchronization with the rising and falling of data strobe signal DQS. Differential amplifier circuits (AMP2) may be provided corresponding to each of the first and second latches for controlling operations of these latches. FIG. 46 shows a signal STR for representing that any one of the above structures may be employed. Strobe signal STR corresponds to data strobe signal DQS.

FIG. 47 schematically shows a structure of output drive circuit ODK shown in FIG. 46. In FIG. 47, output drive circuit ODK includes a P-channel MOS transistor DT1 which is connected between a power supply node and an output node ND and receives on its gate a pull-up control signal /DPU, an N-channel MOS transistor DT2 which is connected between output node ND and a ground node and receives on its gate a pull-down control signal DPD, resistance elements ZP and ZN each connected at one end to output node ND and having a high resistance, a P-channel MOS transistor TT1 connected between the power supply node and resistance element ZP and receiving on its gate a termination control signal/TRM, and an N-channel MOS transistor TT2 connected between resistance element ZN and the ground node and receiving on its gate a termination control signal TRM.

Control signals/DPU and DPD are produced in accordance with internal read data in a data output operation. Termination control signals/TRM and TRM are controlled on a memory unit basis. When a corresponding memory unit is selected, termination control signals TRM and /TRM turn inactive, and both MOS transistors TT1 and TT2 are kept in the off (non-conductive) state. When the corresponding memory unit is not selected, both termination control signals /TRM and TRM are kept active, and MOS transistors TT1 and TT2 are kept in the on (conductive) state.

According to the active termination scheme, termination of the bus is not made on the motherboard, but the termination of the bus signal line is made within the chip. For this termination within the chip, terminating resistances (pure resistances) ZP and ZN are formed in the chip, and termination control transistors TT1 and TT2 are arranged for controlling use/non-use of terminating resistances ZP and ZN.

FIG. 48 is a table listing on/off states of the transistors in the output drive circuit during the data transfer operation of the memory system shown in FIG. 46. FIG. 48 represents the states of the respective transistors in the case when output drive circuit ODK of the memory chip arranged on right side R2 of memory unit MU2 transfers the data to chip set CH.

When the data is to be transferred from the memory chip on right side R2 of memory unit MU2 to chip set CH, output transistors DT1 and DT2 are turned off in all output drive circuits ODK, except the output drive circuit ODK that transfers the data on right side R2 of memory unit MU2. In memory unit MU2, output transistors DT1 and DT2 in activated output drive circuit ODK are selectively driven to the on state in accordance with pull-up control signal/DPU and pull-down control signal DPD. In this output operation, output control signals/DPU and DPD are produced based on the internal read data so that one of output transistors DT1 and DT2 is kept on, and the other is kept off.

For the termination control, all termination control transistors TT1 and TT2 in selected memory unit MU2 are turned off, and all termination control transistors TT1 and TT2 are turned on in chip set CH and memory units MU1 other than memory unit MU2.

Thus, according to the termination control in this active termination scheme, the terminating operation is not stopped on the data sending side, and the termination control is performed by turning on termination control transistors TT1 and TT2 in the memory units other than that on the sending side and the chip set.

For sending data from chip set CH, e.g., to memory unit MU2, output transistors DT1 and DT2 in chip set CH are turned on/off in accordance with the data to be sent, and both termination control transistors TT1 and TT2 in chip set CH are turned off. In memory units MU1 and MU2, all termination control transistors TT1 and TT2 in the output drive circuits are turned on, and output transistors DT1 and DT2 are kept off.

As described above, the active termination scheme for terminating the bus does not require a termination resistance on the motherboard, and an area of the motherboard can be reduced. However, termination control transistors TT1 and TT2 are arranged on the final output stage in the chip. This results in a problem that an input capacitance of the data input/output node increases as described below.

Terminating resistances ZP and ZN are passive elements, and the termination control transistors must be connected thereto for actively controlling the terminating operations. The on resistance of the termination control transistor changes nonlinearly so that it is difficult to change linearly a supply current of this terminating resistance as well as a combined resistance value of the terminating resistance and the terminating controlling transistor. When terminating, MOS transistors TT1 and TT2 are in the on state, and a termination voltage is produced through the resistance division so that termination voltage Vtt deviates from the intermediate voltage level if the linearity is not achieved. Accordingly, such a structure is required that transistors of sufficiently large sizes are used for termination control transistors TT1 and TT2 with the on resistances thereof sufficiently reduced, to increase the linearity of the combined resistance value of terminating resistances ZP and ZN, for accurately setting the output voltage thereof to the intermediate voltage level.

For sufficiently lowering the on resistances of termination control transistors TT1 and TT2, termination control transistors TT1 and TT2 must have sizes similar to those of output transistors DT1 and DT2. This increases a parasitic capacitance by about 1 pF per data input/output node. If the data Input/output node has a capacitance of about 5 pF in a structure with output transistors D1 and D2 merely arranged as in a conventional output drive circuit, the capacitance of data input/output node increases to about 6 pF when the termination control transistors TT1 and TT2 are used. If the capacitance of data input/output node increases, the parasitic capacitance of the bus signal line increases so that fast charging and discharging of signal lines of the bus cannot be performed. Therefore, it is impossible to increase the transfer frequency for increasing the transfer rate.

FIG. 49 conceptually illustrates a relationship between an input capacitance and an operation frequency. In FIG. 49, the abscissa represents an input capacitance, and the ordinate represents an operation frequency. A curve represents a boundary between operative and nonoperative regions. As illustrated in FIG. 49, the operable frequency becomes low as the input capacitance increases, and becomes high as the input capacitance decreases.

With increase in input capacitance, the frequency region allowing a normal operation lowers, and fast data transfer is impeded. Further, a parasitic capacitance of a bus signal line (data bus line) increases, and therefore the charge/discharge current increases so that the current consumption disadvantageously increases.

If a termination control transistor of a size similar to that of an output drive transistor is arranged in the chip, a chip output stage disadvantageously occupies a large area.

SUMMARY OF THE INVENTION

An object of the invention is to provide an interface circuit and a semiconductor device, which can transfer data fast without increasing current consumption.

Another object of the invention is to provide an interface circuit and a semiconductor device, which can transfer data fast while suppressing increase in chip size.

Still another object of the invention is to provide an interface circuit, which can achieve a system capable of fast data transfer in an active termination scheme.

According to a first aspect of the invention, an interface circuit includes a first transistor for driving an output node to a first voltage level in accordance with an internal signal when the interface circuit is active, and being turned off when the interface circuit is inactive; and at least one second transistor being turned off when the interface circuit is active and the first transistor is on, and being selectively turned on to drive the output node to a second voltage level of a polarity different from that of the first voltage when the interface circuit is inactive.

According to a second aspect of the invention, an interface circuit includes a termination transistor coupled to an input node, and being turned on to drive the input node to a first power supply voltage level when a signal is applied to the input node; and an internal signal producing circuit for producing an internal signal in accordance with the signal applied to the input node. The input node is driven to a second power supply voltage level in accordance with the signal applied to the input node.

According to a third aspect of the invention, a semiconductor device includes a plurality of interface circuits commonly connected to an output node, each for selectively driving the output node to a first power supply voltage level in accordance with a corresponding internal signal when made active. The plurality of interface circuits is alternatively activated when the semiconductor device is selected. Each of the interface circuits includes an output drive transistor for driving the output node to the first power supply voltage level in accordance with the corresponding internal signal when the each interface circuit is active, and at least one termination transistor selectively turned on to drive the output node to a second power supply voltage level of a polarity different from that of the first power supply voltage when the each interface circuit is inactive.

In the interface circuit, data is transferred in an open drain method on the data sending side, and a bus signal line is terminated by a termination transistor at least on the receiving side. Therefore, it is not necessary to arrange a terminating resistance in a semiconductor chip, and a chip area can be reduced.

Since the output node is directly driven by the terminating transistor without using a termination resistance, the size of the terminating transistor can be made small, and a parasitic capacitance of the output node can be reduced. Therefore, data can be transferred fast with low current consumption. Also, an area occupied by the output circuit can be reduced.

Further, a power supply voltage is used as a terminating voltage, and it is not necessary to produce an intermediate voltage for termination. Therefore, the termination voltage at an intended voltage level can be accurately and stably produced even if the terminating transistor having non-linear operation characteristics is used. Since the linearity in on-resistance value is not required, transistors of small sizes can be used for terminating the signal lines of a bus.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a signal waveform in a data transfer operation in a termination control method according to the invention;

FIG. 2 shows a structure of an output drive circuit according to a first embodiment of the invention;

FIGS. 9A and 9B represent the states of transistors of the output drive circuits in a first termination control mode according to a second embodiment of the invention;

FIGS. 10A and 10B represent the states of the transistors of the output drive circuits in a second termination control mode according to the second embodiment of the invention;

FIGS. 11A and 11B represent the states of the transistors of the output drive circuits in a third termination control mode according to the second embodiment of the invention;

FIG. 23 shows by way of example structures of primitive window detecting circuits and a local window detecting circuit shown in FIG. 22;

FIG. 47 shows a structure of an output drive circuit shown in FIG. 46;

FIG. 48 illustrates states of transistors in a data transfer operation of the output drive circuit shown in FIGS. 46 and 47; and FIG. 49 shows a relationship between a capacitance of an output node and an operation frequency.

DESCRIPTION OF THE PREFERRED EMBODIMENTS

[First Embodiment]

Figure 3:
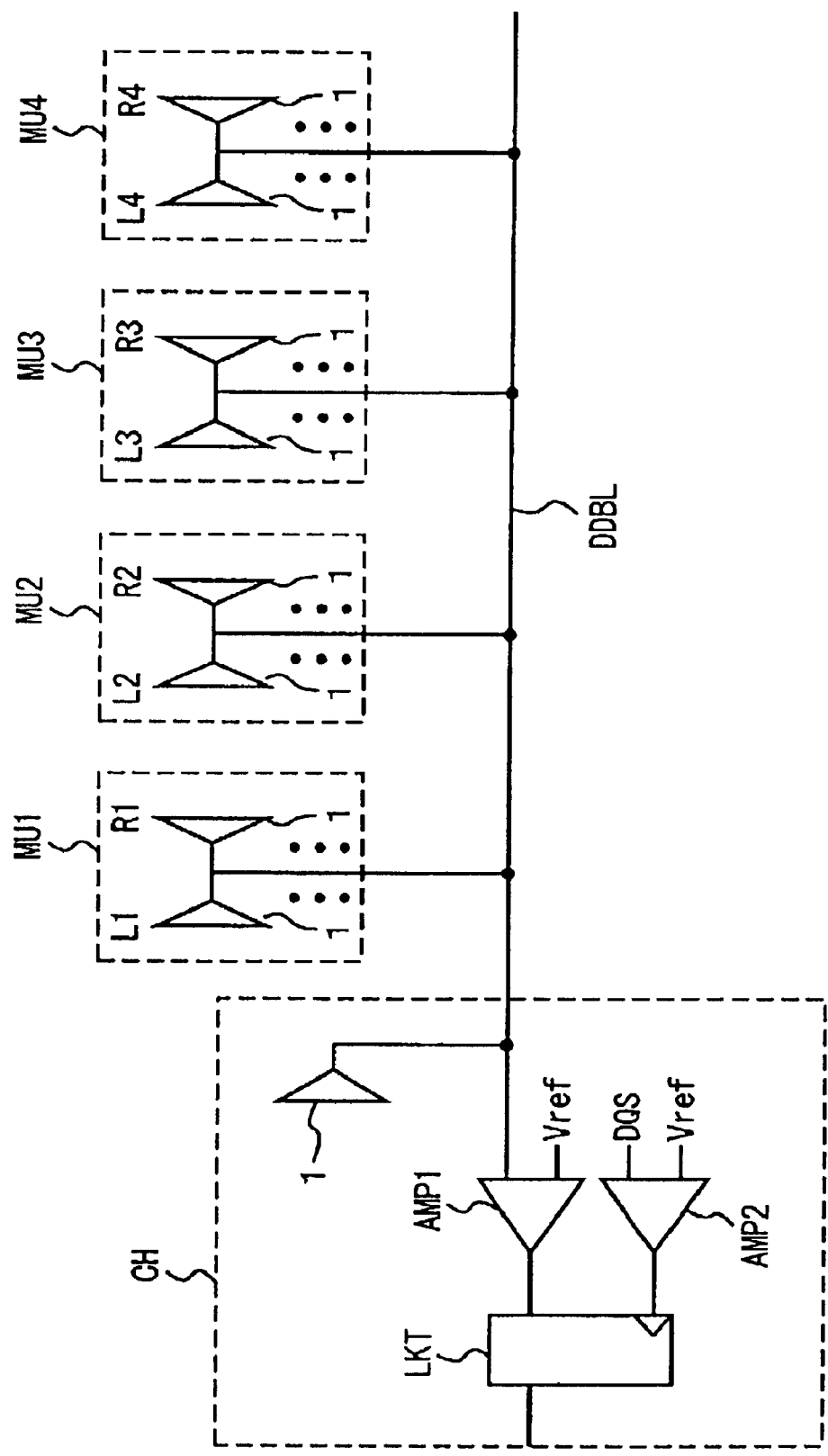
FIG. 3 schematically shows by way of example a structure of a memory system according to the first embodiment of the invention.

FIG. 1 shows signal waveforms in a data transfer operation of an interface circuit according to the invention. As shown in FIG. 1, a termination voltage of a data bus line is set to a level of a power supply voltage VDDQ, not to an intermediate voltage. In the data transfer operation, a signal at the level of power supply voltage VDDQ is a signal at an H level, and a signal at L level is a signal at a ground voltage level. Since the termination voltage of the data bus line is at power supply voltage VDDQ level, it is impossible to determine on a receiving side (chip set) whether a first transferred data is at H level or L level, when this first transferred data is at H level. Therefore, data strobe signal DQS is lowered to the ground voltage level in the cycle immediately before the data transfer, and then is toggled from the ground voltage level (i.e., is changed between L and H levels) in synchronization with the data transfer.

By setting the termination voltage of this bus signal line to power supply voltage VDDQ, it is not necessary to employ a termination voltage generating circuit dedicated to generation of the intermediate voltage. Thus, an occupying area on a motherboard can be reduced, and also a current consumption can be reduced.

Further, a transistor for termination is not required to be linear in on-resistance because it is not necessary to set the termination voltage to an intermediate voltage. Accordingly, it is merely required to supply a certain amount of charges to an output node during half a cycle of the data transfer clock signal, and therefore, the size of the terminating transistor can be sufficiently reduced.

FIG. 2 shows a structure of an output drive circuit according to the first embodiment of the invention. The output drive circuit shown in FIG. 2 is arranged corresponding to each respective output node in each memory chip. In FIG. 2, an output drive circuit 1 includes a P-channel MOS transistor (insulated gate field effect transistor) 11 which is connected between a power supply node and an output node 14 and receives on its gate a pull-up control signal /PUP1, a P-channel MOS transistor 12 which is connected between the power supply node and output node 14 and receives on its gate a termination control signal /PUP2, and an N-channel MOS transistor 13 which is connected between output node 14 and a ground node and receives on its gate a complementary internal read data/RD.

MOS transistor 12 has a smaller size than MOS transistor 11. Thus, MOS transistors 11 and 12 have different channel widths (W) from each other, and the channel width of MOS transistor 11 is larger than that of MOS transistor 12. MOS transistor 13 has the largest size to drive the bus line at high speed in accordance with the internal read data.

According to the structure of output drive circuit 1 shown in FIG. 2, when output drive circuit 1 is activated for driving output node 14 in accordance with internal read data/RD, MOS transistor 12 for termination is set to the off state (non-conductive state), and MOS transistor 11 for termination is selectively set to the on state (conductive state) in accordance with the internal read data. When MOS transistor 13 drives output node 14 to the ground voltage level, MOS transistor 11 is turned off so that output node 14 is driven in a so-called open drain scheme, and is driven to the ground voltage level at high speed.

In the data output operation, if MOS transistor 13 is set to the off state (non-conductive state) in accordance with internal read data /RD, MOS transistor 11 is set to the on state. MOS transistor 12 in the selected output drive circuit maintains the off state. When data is to be transferred from another memory unit or chip set, MOS transistor 12 is turned on to serve as an auxiliary transistor supplying a termination voltage. On the receiving side, MOS transistor 11 is turned on.

FIG. 3 shows by way of example a bus topology in the memory system according to the first embodiment of the invention. FIG. 3 shows a structure of a portion related to data bus line DDBL transferring data of one bit.

In FIG. 3, memory units MU1–MU4 are commonly coupled to data bus line DDBL. One of these memory units MU1–MU4 is selected and accessed for data. Each of memory units MU1–MU4 is formed of a DIMM, and memory chips are arranged on opposite surfaces of a substrate (module board) arranged therein. In FIG. 3, the opposite surfaces of each module board (substrate) are represented as a left side L and a right side R, respectively. In each memory chip, output drive circuit 1 is arranged corresponding to each data output node. In FIG. 3, only one output drive circuit 1 provided in one of the memory chips is representatively shown on each of left and right sides L(L1–L4) and R(R1–R4) in each of memory units MU1–MU4.

Chip set CH includes a differential amplifier circuit AMP1 for producing a pre-internal signal in accordance with a signal on data bus line DDBL and a reference voltage Vref, a differential amplifier circuit AMP2 for producing a latch timing signal in accordance with data strobe signal DQS and reference voltage Vref, and a latch circuit LKT for latching an output signal of differential amplifier circuit AMP1 in accordance with an output signal of differential amplifier circuit AMP2.

According to this memory system, data is transferred in the DDR mode, and latch circuit LKT performs a latching operation in accordance with the rising and falling of data strobe signal DQS. Accordingly, latch circuit LKT includes a latch for taking in the data applied in response to the rising of data strobe signal DQS, and a latch for taking in the data applied in response to the falling of data strobe signal DQS. In this structure for alternately latching the output signal (pre-internal signal) of differential amplifier circuit AMP1, i.e., the data applied in synchronization with the rising and falling of data strobe signal DQS, the latch entering the latch state in response to H level of the output signal of differential amplifier circuit AMP2 is arranged in parallel with the latch entering the latch state in response to L level of the output signal of differential amplifier circuit AMP2, and these latches are commonly supplied with the output signal of differential amplifier circuit AMP1.

Chip set CH further includes an output drive circuit 1 for transferring the output data to data bus line DDBL. Therefore, data bus line DDBL transfers both the write data for a memory unit and the data read from a memory unit.

Figures 4, 5, 6:
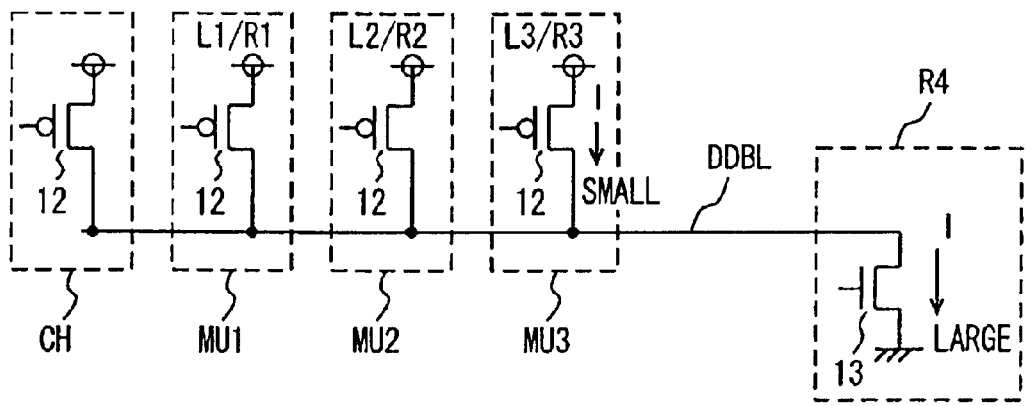
FIG. 4 is a list representing the states of transistors of output drive circuits according to the first embodiment of the invention.
FIG. 5 shows a termination state of a bus with transistors in the states shown in FIG. 4.
FIG. 6 is a list representing the states of the transistors of output drive circuits in a termination control method according to the first embodiment of the invention.

FIG. 4 represents the states of the transistors of output drive circuits 1 in the case when L level data is transferred to chip set CH from the memory chip on right side R4 of memory unit MU4.

In FIG. 4, unselected memory units MU1–MU3 are entirely in the unselected state so that each of output drive circuits 1 of these memory units MU1–MU3 is in such a state that MOS transistors 11 and 13 are off, and MOS transistor 12 is on. MOS transistor 12 has a small size (channel width), and has a relatively small current drive capability. In selected memory unit MU4, MOS transistors 11 to 13 in output drive circuit 1 of the memory chip on left side L4 are turned off. In the selected memory chip on right side RU of memory unit MU1, data at L level is required to output so that MOS transistor 13 is turned on, and MOS transistors 11 and 12 are turned off. In memory unit MU4, MOS transistor 12 is turned off.

In chip set CH on the data receiving side, MOS transistors 11 and 13 of output drive circuit 1 are turned off, and MOS transistor 12 is turned on. In memory units MU1–MU3, MOS transistors 12 are turned on, and MOS transistor 12 of output drive circuit 1 in chip set CH is turned on. In this state, therefore, MOS transistor 12 of a small size provided for termination control is turned on to function as a pull-up element (termination element) on each of left and right sides L and R of all memory units MU1–MU3.

On right side R4 of memory unit MU4, MOS transistor 13 of output drive circuit 1 is turned on to discharge data bus line DDBL with a large current driving power. In chip set CH, MOS transistor 12 of output drive circuit 1 is on. These MOS transistors 12 function as pull-up (termination) elements to data bus signal line DDBL. These MOS transistors 12 are merely required to function as the pull-up elements, and are not required to produce the termination voltage at the intermediate voltage level accurately. Further, the linearity is not required for the supplying currents and resistance values of these MOS transistors 12. For transferring data in the DDR mode, therefore, these MOS transistors 12 are merely required, as a whole, to have a function of raising the level of data bus signal line DDBL from the ground voltage level to or above reference voltage Vref within half a clock cycle of the transfer clock signal. Accordingly, MOS transistors 12 can have reduced sizes.

FIG. 6 shows states of the transistors of output drive circuits in the case when data at H level is transferred from the memory chip on right side R4 of memory unit MU4 to chip set CH. When data at H level is to be transferred, output drive circuit 1 of the memory chip on right side R4 of memory unit MU4 on the sending side enters such a state that MOS transistor 11 is on, and MOS transistors 13 and 12 are off. In memory units MU1–MU3 and chip set CH, the on/off states of MOS transistors 11–13 in output drive circuits 1 are the same as those in transferring data at L level.

Figure 7:
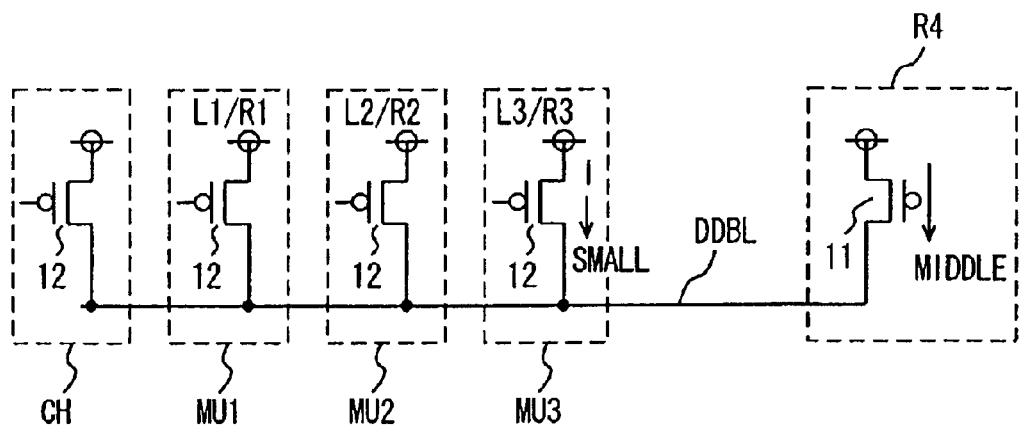
FIG. 7 shows transistors terminating a bus line when the transistors in the output drive circuits are in the states shown in FIG. 6.

In this operation of transferring the data at H level, MOS transistor 11 of output drive circuit 1 on right side R4 of memory unit MU4 is turned on as shown in FIG. 7. MOS transistor 11 supplies a current to data bus signal line DDBL with a smaller current driving power than MOS transistor 13. Therefore, the size of MOS transistor 11 can be much smaller than that of the drive transistor 13. Particularly, in the operation of pulling up data bus signal line DDBL, MOS transistors 12 in output drive circuits 1 of memory units MU1–MU3 and chip set CH are on so that MOS transistor 11 can co-operate with these MOS transistor 12 to drive data bus signal line DDBL to H level. Accordingly, the size of MOS transistor 11 can be made sufficiently smaller than that of the output drive transistor 13, and the input capacitance of the output drive circuit 1 can be sufficiently made small.

During standby, in the output drive circuits, all MOS transistors 12 are in the on state, and MOS transistors 11 and 13 are all in the off state.

When data is to be transferred from chip set CH to memory unit MU, the termination control of each output drive circuit can be implemented by exchanging the states of transistors shown in FIGS. 4 and 6 between those on the sending side and the receiving side.

Figure 8:
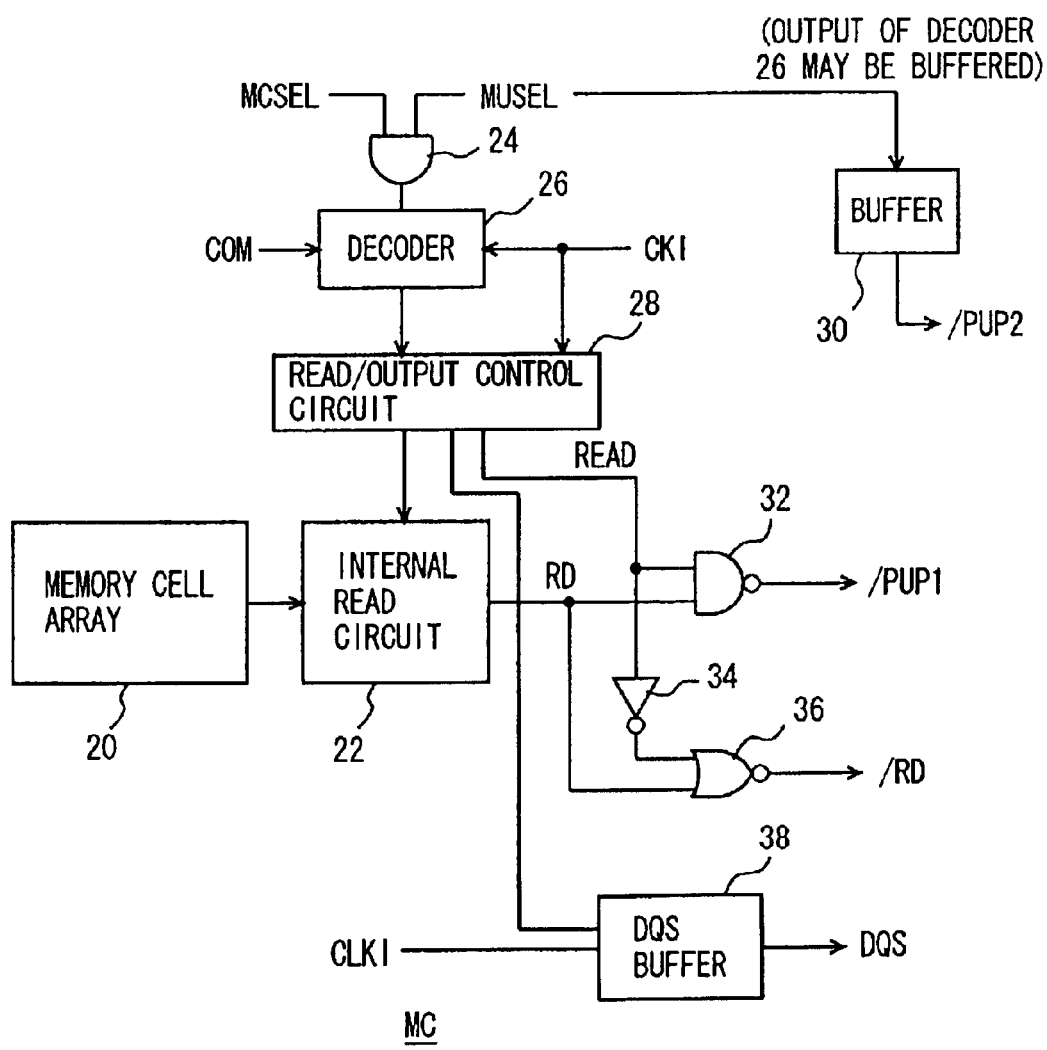
FIG. 8 shows by way of example a structure of a portion for generating a termination control signal according to the first embodiment of the invention.

FIG. 8 schematically shows a structure of a termination control signal generating portion according to the first embodiment of the invention. FIG. 8 shows a structure of a portion for generating the termination control signal in one memory chip. Memory chip MC includes a memory cell array 20 having a plurality of memory cells, and an internal read circuit 22 for reading out data from memory cell array 20 and producing internal read data RD. In memory cell array 20, the memory cells are arranged in rows and columns. Internal read circuit 22 includes circuitry related to selection of columns in memory cell array 20, amplifying circuit for amplifying data read out from memory array, and a parallel-serial conversion circuit for performing parallel-serial conversion in the data output operation in the DDR mode. Internal read circuit 22 reads data of 2 bits in parallel for one data output node in one clock cycle, converts the 2-bit data into serial data and transfers the data in synchronization with the rising and falling edges of the clock signal, respectively.

Output drive circuit 1 is the final output stage driving this output node, and drives the output node in accordance with the data subjected to parallel-to-serial conversion.

The data control signal generating portion includes a gate circuit 24 receiving a memory module select signal MUSEL designating the memory unit and a memory chip select signal MCSEL designating the memory chip, a decoder 26 for decoding a command CM applied thereto in synchronization with an internal clock signal CLKI when the output signal of gate circuit 24 is active, and a read/output control circuit 28 for producing control signals required for reading and outputting internal data in synchronization with internal clock signal CLKI when a read operation mode instructing signal is applied from decoder 26. FIG. 8 representatively shows a read activating signal READ applied from read/output control circuit 28 for determining an external data read period. Under the control of read/output control circuit 28, internal read circuit 22 performs selection of a memory cell as well as transfer, amplification and parallel-to-serial conversion of the internal memory cell data.

Memory chip select signal MCSEL designates the memory chips on the right or left side in the memory unit. If memory chip MC is singly designated and the memory chip MC is configured into a bank, a bank address may be used. Further, a chip enable signal may be used for designating the semiconductor chip alone.

The data control signal generating portion further includes a buffer circuit 30 which buffers module select signal MUSEL to produce termination control signal /PUP2, an NAND circuit 32 which receives internal read data RD from internal read circuit 22 and read activating signal READ to produce termination control signal /PUP1, an inverter 34 for inverting read activating signal READ, and a NOR circuit 36 which receives an output signal of inverter 34 and internal read data RD to produce final internal read data/RD.

Module select signal MUSEL is kept active while the module is selected and accessed. Module select signal MUSEL corresponds to termination control signal /TRM in the structure shown in FIG. 47. In each module, on/off of termination control transistor 12 is controlled independently of the other modules. When termination control transistor 12 is controlled at a memory chip level, a signal obtained by logical product of read activating signal READ and module select signal MUSEL is utilized.

Read activating signal READ is an active high signal. When read activating signal READ is active, NAND circuit 32 operates as an inverter, to invert internal read data RD for producing termination control signal /PUP1. NOR circuit 36 operates as an inverter to produce final internal read data /RD in accordance with internal read data RD when read activating signal READ is active.

Memory chip MC further includes a DQS buffer 38 for producing data strobe signal DQS in accordance with internal clock signal CLKI under the control of read/write control circuit 28 in the data read operation. DQS buffer 38 falls data strobe signal DQS to L level in synchronization with internal clock signal CLKI in a clock cycle immediately before the clock cycle, in which external data is output. Thereafter, DQS buffer 38 produces data strobe signal DQS in synchronization with internal clock signal CLKI while the external data is output. Data DQ is transferred in synchronization with internal clock signal CLKI, and therefore, data DQ is externally transferred in synchronization with the data strobe signal.

When the corresponding memory unit is select and the memory chip is selected, module select signal MUSEL becomes active so that termination control signal /PUP2 generated from buffer circuit 30 attains H level to turn off termination control transistor 12.

Also, the output signal of gate circuit 24 turns H level of the active state, and decoder 26 is activated to decode the command. When the data read mode is designated, internal read circuit 22 selects a memory cell from memory cell array 20, and produces internal read data RD in synchronization with internal clock signal CLKI under the control of read/output control circuit 28.

In output drive circuit 1, MOS transistor 12 is off. When read activating signal READ from read/output control circuit 28 is inactive, termination control signal /PUP1 generated from NAND circuit 32 is at H level, and final internal read data /RD generated from NOR circuit 36 is at L level. Before the data reading, therefore, MOS transistors 11 to 13 in drive circuit 1 are all off.

When read activating signal READ turns active, termination control signal /PUP1 and final internal read data/RD change in accordance with internal read data RD.

In the unselected memory unit, read activating signal READ is inactive so that termination control signal /PUP2 is at L level, termination control signal /PUP1 is at H level, and final internal read data/RD is at L level. In the memory chip of the unselected memory unit, MOS transistor 12 of output drive circuit 1 is kept on.

When memory chip select signal MCSEL simultaneously selects all the memory chips on the right or the left side in a memory module, the activation/deactivation of the memory chip single is set based on the bank address while utilizing each memory chip single as a bank. Memory chip select signal MCSEL may be a signal designating right/left side in the memory module, or a signal designating the corresponding chip alone. By utilizing logical product of module select signal MUSEL and read activating signal READ as a termination control signal, it is possible in the selected memory unit to control the on/off of the termination control transistors in the memory chip independently of the other memory chips. Buffer circuit 30 may be configured to latch the output signal of decoder 26. By latching the output signal of decoder 26 in accordance with module select signal MUSEL, termination control signal /PUP2 can be controlled on a memory chip basis.

Chip set CH, receiving data from the memory unit, is in the input mode, and termination control signal /PUP2 is kept active at L level, termination control signals /PUP1 and /PUP2 are at H level, and final internal read data /RD is fixed to L level. When outputting the data by this chip set CH, termination control signal /PUP2 is set to H level regardless of the memory chip and memory module of the target, and termination control signal /PUP1 and final internal read data /RD are set to the logical levels corresponding to internal read data RD. In this case, therefore, in chip set CH, decoder 26 in the read/output control portion merely operates to produce termination control signals /PUP1 and /PUP2 in accordance with command COM specifying the operation mode.

According to the first embodiment of the invention, therefore, the data transfer operation is performed by transferring external data in the open drain scheme, and the data bus signal line is terminated at least on the receiving side. Therefore, neither the terminating resistance nor the termination control transistor is required, and fast data transfer can be performed with a small occupying area.

For transferring the control signal and address signal from chip set CH to memory units MU1–MU4, termination control transistors 11 and 12 are provided for the control signal bus line and address bus signal line. These termination control transistors provided for the address/control signal lines are controlled merely in such a manner that termination control signal /PUP2 is inactive when memory module select signal MUSELL and memory chip select signal MCSEL are both in the selected state, and termination control signal /PUP2 is kept active when at least one of memory module select signal MUSEL and memory chip select signal MCSEL is in the selected state. When memory module select signal MUSEL and memory chip select signal MCSEL are both in the selected state, termination control signal /PUP1 is set to the active state. Thereby, the signals can likewise be transferred fast in response to the input signal of the memory chip by transferring the control signal and address signal from the chip set in the open drain scheme.

Meanwhile, the transistor 12 in the output drive circuit 1 on the left side L4 in the memory module. MU4 is kept off in data transfer from memory module MU4. However, that transistor 12 may be kept on in the data transfer from memory module MU4.

[Second Embodiment]

FIGS. 9A and 9B represent the states of the transistors in the output drive circuits of the respective memory units and chip set in the case when the data transfer is performed in a first termination control mode according to a second embodiment of the invention. A structure of a memory system according to the second embodiment includes four memory units MU1–MU4 and one chip set CH, similarly to the first embodiment. These memory units MU1–MU4 are commonly coupled to data bus line DDBL. Output drive circuits of memory units MU1–MU4 and chip set CH have the same structures as those shown in FIG. 2, and each include termination controlling transistors 11 and 12 and output driving transistor 13.

FIG. 9A represents the states of the transistors in the output drive circuits in the case when L level data is transferred from the memory chip on right side R4 of memory unit MU4 to chip set CH. For transferring the L level data in accordance with this first termination control mode, all transistors 11–13 of the output drive circuits in unselected memory modules MU1–MU3 are kept off. In the selected memory module MU4, all output drive transistors 11–13 of the memory chips on unselected left side L4 are made off.

On selected right side R4 in selected memory module MU4, MOS transistor 13 of the output drive circuit in the selected memory chip is made on in accordance with the internal read data. In this output drive circuit of the selected memory chip, MOS transistors 11 and 12 for termination control are kept off.

In the output drive circuit of chip set CH on the receiving side, MOS transistor 11 for termination control is turned on, and other MOS transistors 12 and 13 are kept off. In this case, therefore, MOS transistor 13 in selected memory chip (R4) drives the data bus line to L level, and MOS transistor 11 for the termination control in chip set CH terminates the data bus line.

Conversely, for transferring data at H level from the selected memory chip on right side R4 of memory module MU4 to chip set CH, in the output drive circuit in the selected memory chip on right side R4 of memory module MU4, termination control transistor 11 is turned on in accordance with internal read data, and the transistors 12 and 13 are turned off. In chip set CH, termination control MOS transistor 11 in the output drive circuit is turned on. Other transistors in the output drive circuits of memory modules MU1 to MU3 are all kept off. In this case, therefore, the data bus line is pulled up by termination control transistors 11 in the output drive circuits on the data sending side and the receiving side. In this operation, termination control MOS transistor 11 in the output drive circuit of the selected memory chip drives the data bus line to H level together with termination control transistor 11 in the output drive circuit of the chip set CH. Accordingly, even if termination control transistor 11 has a reduced size, when the data bus line can be driven from the ground voltage level to or above reference voltage Vref, the data at H level can be accurately sampled on the receiving side. Since termination controlling MOS transistors 11 on the sending and receiving sides pull up the data bus line, each termination control MOS transistor 11 is not required to have a large drive power. Accordingly, the size of termination control MOS transistor 11 can be sufficiently reduced, and thus the parasitic capacitance of the output node can be sufficiently reduced.

FIGS. 10A and 10B represent the states of the transistors of the output drive circuits in a second termination control mode according to the second embodiment of the invention. The system in FIGS. 10A and 10B likewise uses four memory units MU1–MU4 and chip set CH. The structure of the output drive circuit is the same as that shown in FIG. 2. FIG. 10A represents the states which the transistors in the output drive circuits enter when data at L level is transferred from the selected memory chip on right side R4 of memory unit MU4 to chip set CH. In the second termination control mode, in unselected memory modules MU1–MU3, termination controlling MOS transistor 12 is kept on (conductive), and termination control MOS transistors 11 and 13 are made off (non-conductive). In the memory chip on selected left side L4 of selected memory module MU4, all the MOS transistors of the output drive circuit are made off.

When data at L level is to be transferred from the selected memory cell on right side R4 of memory unit MU4, N-channel MOS transistor 13 for discharging the output node is turned on in the output drive circuit of the memory chip on right side R4. In memory unit MU4, other transistors are all maintained in the off state.

In the output drive circuit of chip set CH, termination controlling MOS transistor 11 is turned off, termination controlling MOS transistor 12 is turned on, and output drive MOS transistor 13 is turned off. In this case, the termination (pull-up) of the data bus line is performed by termination controlling MOS transistors 12 in the unselected memory modules and MOS transistor 12 in the output drive circuit of chip set CH.

FIG. 10B represents the states, which the output driving transistors enter when the data at H level is transferred in this second termination control mode from the selected chip on right side R4 of memory unit MU4 to chip set CH. For transferring this H level data to chip set CH, all MOS transistors 11–13 of the output drive circuit in memory unit MU4 are maintained in the off state. In unselected memory units MU1–MU3, only termination controlling MOS transistors 12 are kept on.

In chip set CH, termination controlling MOS transistor 12 is likewise kept on. For transferring the H level data, therefore, the pull-up of data bus line is performed by termination controlling MOS transistors 12 in chip set CH and unselected memory units MU1–MU3. In this case, if a large drive power of termination control MOS transistor 11 is substantially the same as a sum of the current drive powers of, e.g., six MOS transistors 12, the data bus line can be pulled up sufficiently fast to H level.

FIGS. 11A and 11B represent the states of the transistors in the output drive circuits in a data transfer in a third termination control mode according to the second embodiment of the invention. In the third termination control mode, the respective output driving transistors attain the same states as those in the second termination control mode shown in FIGS. 10A and 10B, except for that termination control MOS transistor 11 in the selected memory chip is turned on when H level data is to be transferred.

In this third termination control mode, the pull-up of the data bus line is performed by termination controlling MOS transistors 12 in the unselected memory units and chip set as well as termination controlling MOS transistor 11 in the selected memory chip. In this case, since termination controlling MOS transistor 11 having a relatively large drive power is used for transferring the H level data, the H level data can be reliably transferred.

Figure 12:
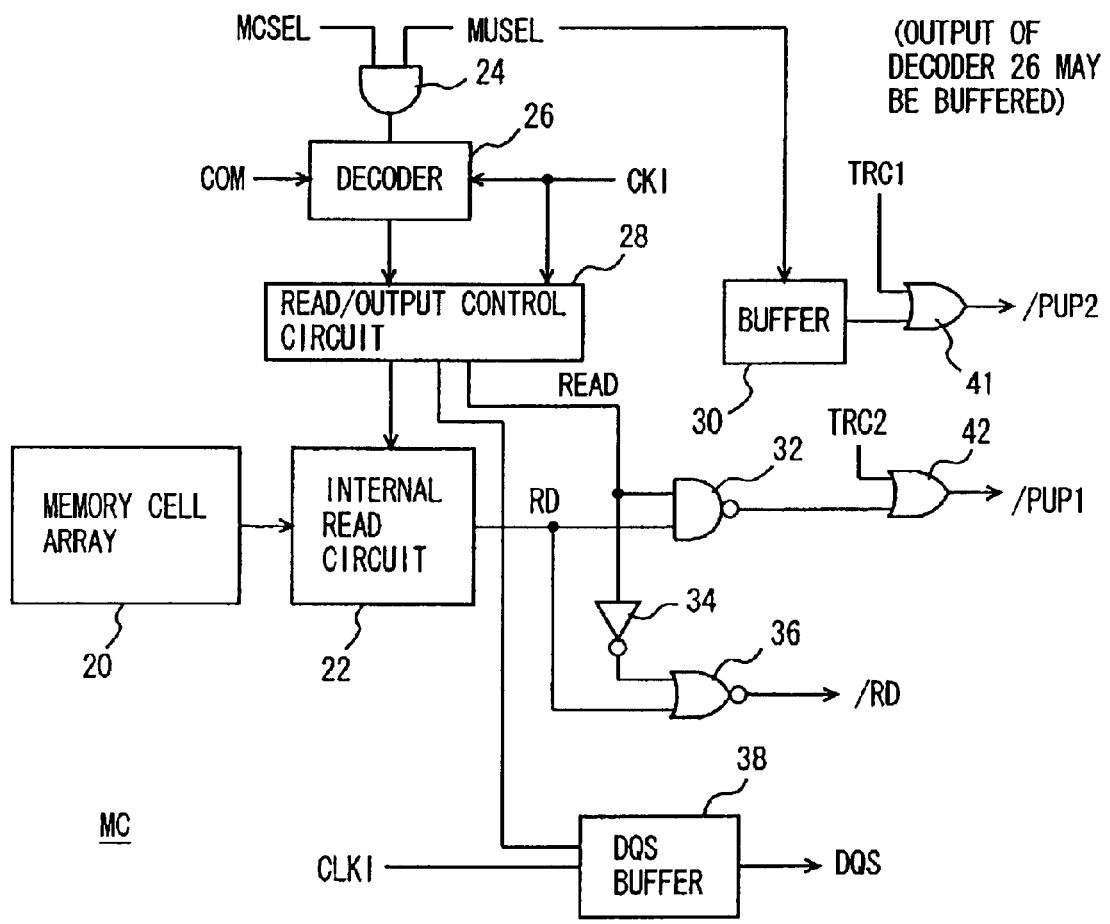
FIG. 12 schematically shows a structure of a portion for generating the termination control signal according to the second embodiment.

FIG. 12 shows by way of example a structure of a portion of generating a termination control signal in the memory chip according to the second embodiment of the invention. The termination control signal generating portion shown in FIG. 12 differs from that shown in FIG. 8 in the following points. In order to control the manner of generating the termination control signal in accordance with the termination control mode, there are provided an OR gate 41 which receives the output signal of buffer circuit 30 and a termination mode instructing signal TRC1 and outputs termination control signal /PUP2, and an OR gate 42 which receives the output signal of NAND gate 32 and termination control mode instructing signal TRC2 and produces termination control signal /PUP 1.

Termination control signal TRC1 designates a first termination control mode when made active. Termination control signal TRC2 designates a second termination control mode when made active. When termination control signals TRC1 and TRC2 are both inactive at L level, a third termination control mode is designated.

In the first termination control mode, termination control mode instructing signal TRC1 is set to H level, and termination control mode instructing signal TRC2 is set to L level. In this state, termination control signal /PUP2 is fixed at H level, and termination controlling MOS transistor 12 maintains the off state. Termination control signal /PUP1 is produced in accordance with the output signal of NAND circuit 32.

In the second termination control mode, termination control mode instructing signal TRC1 is set to L level, and termination control mode instructing signal TRC2 is set to H level. In this case, transfer control signal /PUP1 is fixed at H level, and termination controlling MOS transistor 11 is fixed in the off state. Termination control signal /PUP2 is produced based on the latch signal of buffer circuit 30 so that termination control signals /PUP2 in the unselected memory units attain L level, and termination control signal /PUP2 in the selected memory unit attains H level.

In the third termination control mode, both termination control mode instructing signals TRC1 and TRC2 are at L level. Therefore, termination control signal /PUP1 is produced in accordance with the output signal of NAND circuit 32, and termination control signal /PUP2 is produced in accordance with the output signal of buffer circuit 30.

Termination control mode instructing signals TRC1 and TRC2 are produced by a fuse program circuit, or by a predetermined bonding pad fixed to a power supply voltage level or a ground voltage level through a bonding wire. Alternatively, termination control mode instructing signals TRC1 and TRC2 may be produced by storage data in a command register.

When chip set CH issues a read command and serves as the data receiving side, termination control signals /PUP1 and /PUP2 are produced in accordance with the selected transfer control mode. More specifically, when the first termination control mode shown in FIGS. 9A and 9B is designated, termination control signals /PUP1 and /PUP2 are set to L- and H levels in chip set CH, respectively. When the second or third termination control mode is designated, chip set CH sets both termination control signals /PUP1 and /PUP2 to H level when issuing the read command instructing the data reading.

Figure 13:
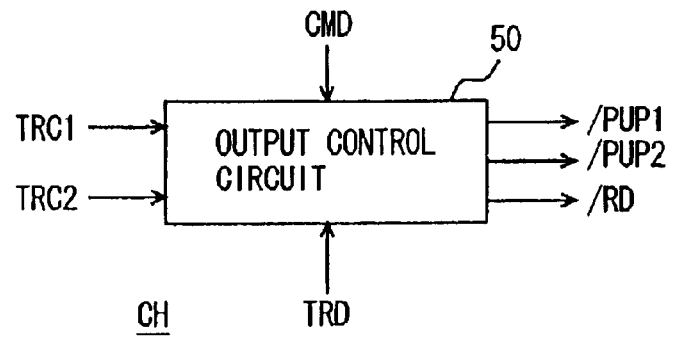
FIG. 13 schematically shows a structure of the termination control signal generating portion in a chip set according to the second embodiment of the invention.

Thus, as shown in FIG. 13, chip set CH receives termination control mode instructing signals TRC1 and TRC2, command CMD instructing writing/reading of data, and transfer data TRD, and produces and supplies termination control signals /PUP1 and /PUP2 as well as output drive control signal /RD in accordance with the designated operation mode to output drive circuit 1 arranged in chip set CH.

When the termination control mode of chip set CH is uniquely determined, the termination control modes of memory units MU1–MU4 may be set by termination control mode instructing signals TRC1 and TRC2 in accordance with the termination control method of this chip set. More specifically, if chip set CH does not use termination control mode instructing signals TRC1 and TRC2, and the termination control mode is fixedly determined in chip set CH, the termination control mode is set according to the termination control mode used in each respective memory unit. Thereby, the common chip can be used in a plurality of termination control modes.

According to the second embodiment of the invention, as described above, the single output drive circuit can be used for the plurality of termination control manners, and the optimum termination control method according to the system bus structure can be achieved by a common chip structure.

[Third Embodiment]

Figure 14:
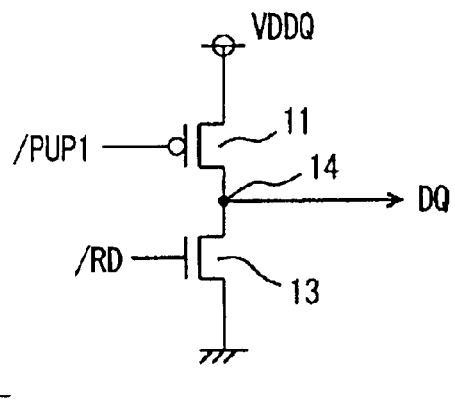
FIG. 14 shows a structure of an output drive circuit according to a third embodiment of the invention.

FIG. 14 shows a structure of output drive circuit 1 according to a third embodiment of the invention. In FIG. 14, output drive circuit 1 includes a P-channel MOS transistor 11 which is connected between the power supply node and output node 14 and receives termination control signal /PUP1 on its gate, and an N-channel MOS transistor 13 which is connected between output node 14 and the ground node and receives output control signal /RD corresponding to the final internal read data on its gate.

In the structure of output drive circuit 1 shown in FIG. 14, termination control MOS transistor 12 having a small current drive power is not provided. In output drive circuit 1 shown in FIG. 14, therefore, the termination control is so performed as to execute the data transfer in accordance with the termination control method shown in FIGS. 9A and 9B. In this case, termination of the bus line is made at least by the chip set on the receiving side or the memory unit, and the data can be accurately transferred.

[Modification]

Figure 15:
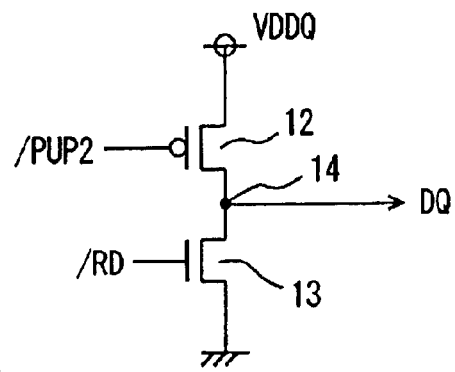
FIG. 15 shows a structure of an output drive circuit in a modification of the third embodiment of the invention.

FIG. 15 shows a structure of a modification of output drive circuit 1 according to the third embodiment of the invention. Output drive circuit 1 shown in FIG. 15 employs, as the termination control transistor, P-channel MOS transistor 12 receiving termination control signal /PUP2 on its gate, and does not employ P-channel MOS transistor 11 receiving termination control signal /PUP1 on its gate.

In the structure of the output drive circuit shown in FIG. 15, data transfer is made by performing the termination control in accordance with the second termination control method represented in FIGS. 10A and 10B. In this case, the plurality of termination controlling MOS transistors are simultaneously turned on to equivalently terminate the bus signal line, and therefore, the data transfer can be performed accurately. The memory unit or the memory chip on the sending side, with either of the structures shown in FIGS. 14 and 15 transfers the data at L level in the open drain method, and the data can be transferred fast and accurately.

MOS transistors 11 and 12 are merely pull-up transistors, and it is not necessary to set the bus termination voltage to an intermediate voltage even in the structure, in which one termination control transistor is arranged in the output drive circuit. The termination control transistor is not required to have linearity in its operation characteristics and channel resistance. Therefore, the transfer can be performed accurately.

According to the third embodiment, as described above, the output drive circuit employs only one MOS transistor as the termination control transistor so that the area occupied by the drive circuit and the current consumption can be reduced.

[Fourth Embodiment]

Figure 16:
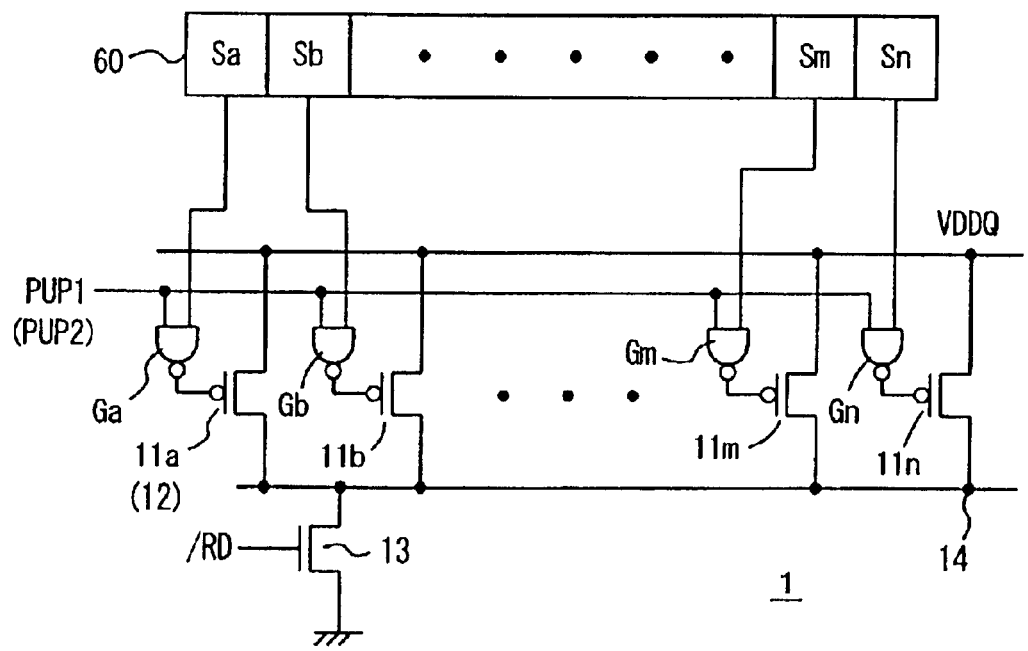
FIG. 16 shows by way of example a structure of an output drive circuit according to a fourth embodiment of the invention.

FIG. 16 schematically shows a structure of an output drive circuit according to a fourth embodiment of the invention. In FIG. 16, a plurality of P-channel MOS transistors 11a–11n for control are commonly coupled to output node 14. Termination control MOS transistors 11a–11n may have the same sizes, and alternatively may also have sizes (channel widths), which are successively doubled such as 1, 2, 4, . . . .

NAND gates Ga–Gn are arranged corresponding to MOS transistors 11a–11n, respectively. NAND gates Ga–Gn receive storage values (bits) Sa–Sn of corresponding registers of a register circuit 60, respectively, and also receive termination control signal PUP1.

Register circuit 60 is, e.g., a command register, and storage contents thereof are set in accordance with a mode register set command. Alternatively, register circuit 60 may be a fuse program circuit, and storage contents thereof may be fixedly set by selectively blowing fuses.

Termination control signal PUP1 is an inverted signal of termination control signal /PUP1 already described in connection with the first to third embodiments. When the bits Sa–Sn stored in register circuit 60 are at H level, gate circuits Ga–Gn operate as inverters. When the bits Sa–Sn stored in register circuit 60 are at L level, NAND gates Ga–Gn output signals at H level to turn off corresponding termination control MOS transistors 11a–11n regardless of the logical level of termination control signal PUP1.

Accordingly, by selectively setting the logical levels of conduction control bits Sa–Sn stored in register circuit 60 to "0" and "1", the size of termination control MOS transistor 11 can be equivalently adjusted so that the termination/pull-up of output node 14 can be performed with an optimum driving power.

If MOS transistor 12 in output drive circuit 1 is formed of a plurality of MOS transistors, a structure similar to the structure shown in FIG. 16 is employed for turning on/off the plurality of transistors to adjust the size of MOS transistor 12.

The output drive circuit shown in FIG. 16 may include, as the termination control transistor(s), both MOS transistors 11 and 12, or only MOS transistor 11 or 12.

[Modification]

Figure 17:
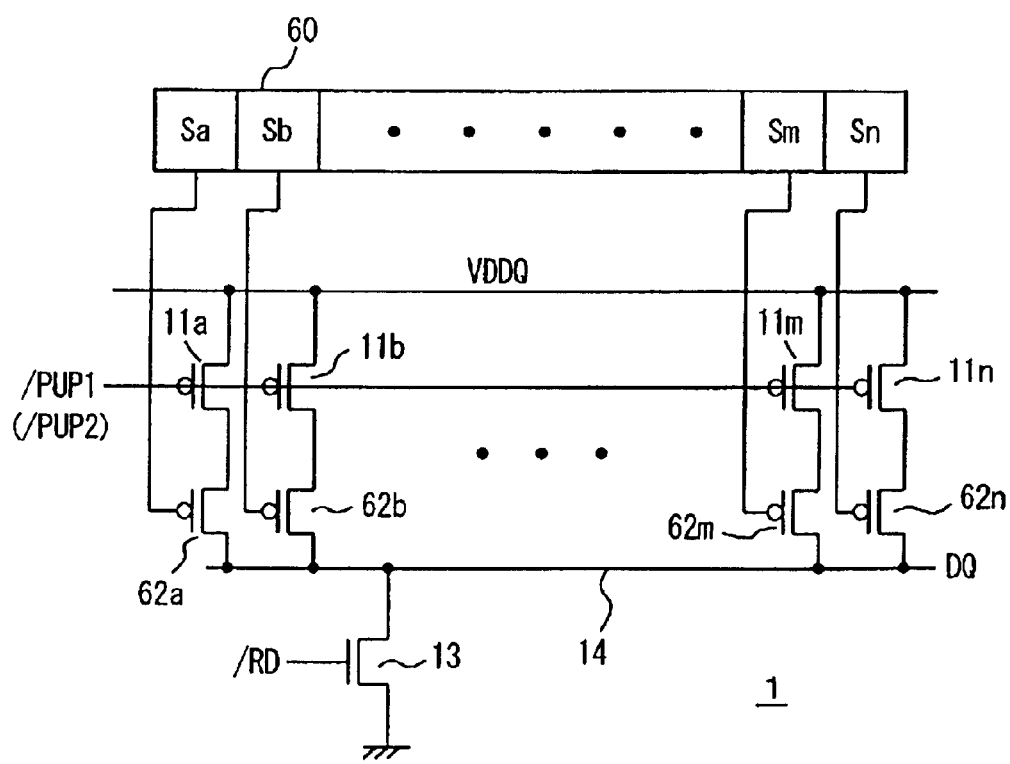
FIG. 17 schematically shows a structure of an output drive circuit in a modification of the fourth embodiment of the invention.

FIG. 17 shows a modification of the output drive circuit according to the fourth embodiment. In FIG. 17, output drive circuit 1 includes P-channel MOS transistors 11a–11n having sources commonly connected to a power supply line, P-channel MOS transistors 62a–62n connected between MOS transistors 11a–11n and output node 14, respectively, and output drive N-channel MOS transistor 13 connected between output node 14 and the ground node. MOS transistors 11a14 11n receive termination control signal /PUP1 on their gates. MOS transistors 62a14 62n receive storage data bits Sa–Sn of register circuit 60 on their respective gates.

In the structure shown in FIG. 17, MOS transistors 62a14 62n are selectively turned on/off in accordance with storage data bits Sa–Sn of register circuit 60, respectively. In accordance with the storage data bits of register circuit 60, it is possible to equivalently adjust the size of termination control P-channel MOS transistor 11 having a relatively large drive power, and the termination/pull-up of output node 14 can be performed with an optimum driving power.

For MOS transistor 12 having a relatively small driving power, register circuit 60 may be provided similarly, and MOS transistor 12 may be formed of a plurality of MOS transistors 12a14 12n. As shown in FIG. 17, MOS transistors, which are selectively turned on/off in accordance with the storage data bits of register circuit 60, respectively, are connected in series with the plurality of transistors 12a14 12n. Thereby, the optimum terminating operation can be achieved meeting a load of the data bus line.

In the structure of this modification, the output drive circuit may include both MOS transistors 11 and 12, or may include only MOS transistor 11 or 12.

In the structures shown in FIGS. 16 and 17, sizes of the termination control MOS transistor(s) 11 and/or 12 are adjusted in accordance with the data bits stored in register circuit 60. However, fusible link elements may be arranged in series to these MOS transistors 11a14 11n, and the sizes of the termination control MOS transistors may be fixedly set by selectively blowing these link elements.

When the sizes of MOS transistors 11 and 12 are to be adjusted, the sizes of these transistors may be adjusted commonly, or may be independently.

According to the fourth embodiment of the invention, as described above, the sizes of termination control transistors can be changed, and it is possible to achieve the memory system that has the optimum terminating capability according to the applied fields and operation environments.

[Fifth Embodiment]

Figure 18:
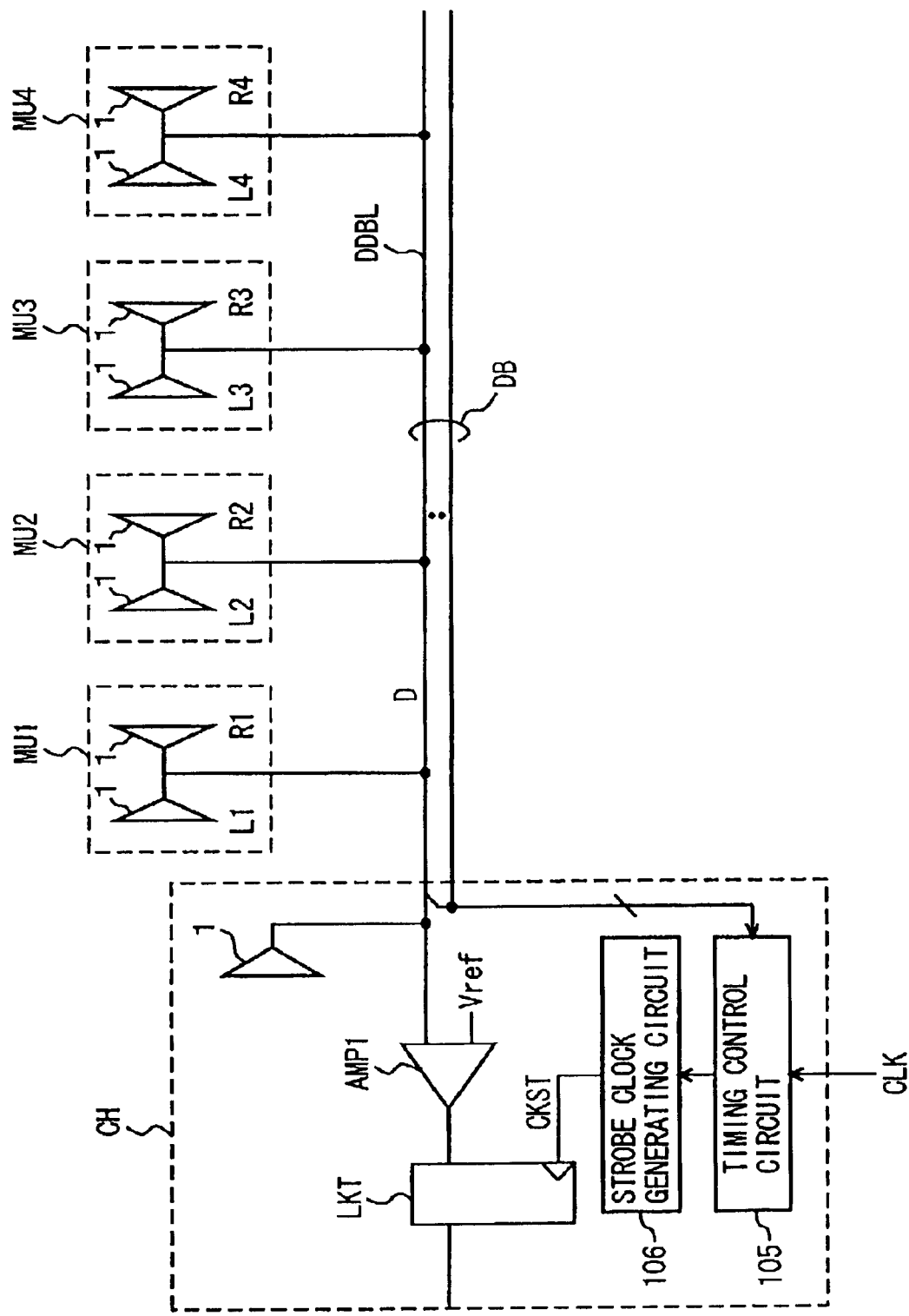
FIG. 18 schematically shows a structure of a memory system according to a fifth embodiment of the invention.

FIG. 18 schematically shows a structure of a memory system according to a fifth embodiment of the invention. In FIG. 18, memory units MU1–MU4 are commonly coupled to data bus line DDBL. These memory units MU1–MU4 have the structures of one of the first to fourth embodiments already described, and include output drive circuits 1 for driving and/or terminating data bus line DDBL.

Chip set CH includes output drive circuit 1 that has the same structure as that of one of the first to fourth embodiments, a differential amplifier circuit AMP1 for comparing the data on data bus line DDBL with reference voltage Vref to produce a pre-internal signal in accordance with the result of comparison, and a latch circuit LKT for latching the output signal of differential amplifier circuit AMP1. Memory units MU1–MU4 do not output data strobe signal DQS. Therefore, chip set CH internally produces data strobe timing instead of data strobe signal DQS.

For producing the data strobe timing, chip set CH includes a timing control circuit 105 which stores data take-in timing information corresponding to respective memory units MU1–MU4 in its internal register circuit, and controls the data take-in timing in accordance with the stored timing information, and a strobe clock generating circuit 106 which produces a strobe clock signal for a data take-in operation under the control of timing control circuit 105. Latch circuit LKT performs the latch operation in accordance with the strobe clock signal generated from strobe clock generating circuit 106.

Specifically, timing control circuit 105 detects a valid window of data for each of memory units MU1–MU4, and controls strobe clock generating circuit 106 to generate the strobe clock signal, which provides an optimum set-up time and an optimum hold time, based on the detected valid window information.

Figure 19:
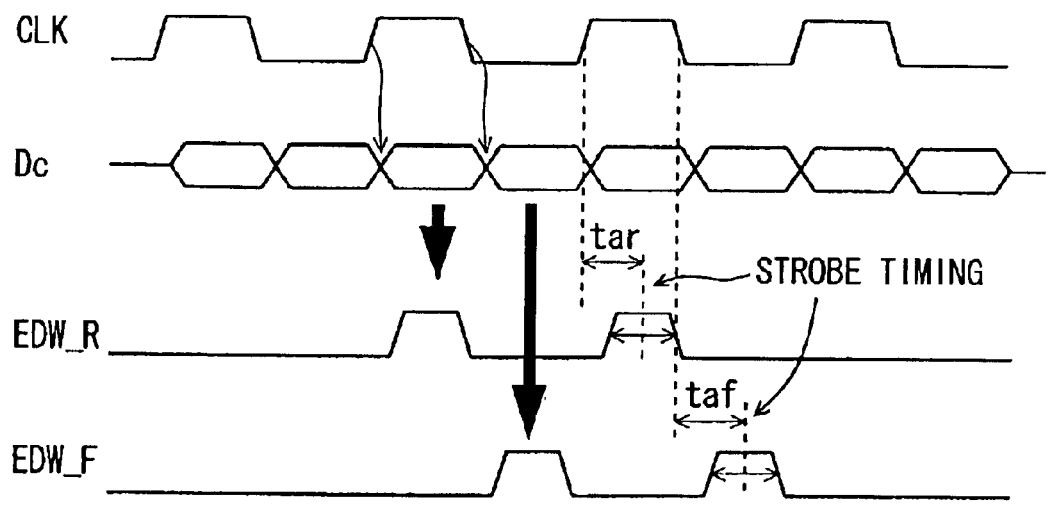
FIG. 19 illustrates a principle of an operation of generating a strobe clock signal in the fifth embodiment of the invention.

FIG. 19 conceptually illustrates an operation of timing control circuit 105 shown in FIG. 18. As shown in FIG. 19, memory units MU1–MU4 operate in the DDR mode. However, the structure, in which chip set CH internally produces the data strobe timing, can be applied to the structure, in which the memory unit operates in a SDR (Single Data Rate) mode to output the data in synchronization with the rising of clock signal CLK, and to the structure, in which the memory unit outputs the data in an EDO (Extended Data Output) mode or a burst EDO mode. In a DRAM operating in the EDO mode, internal circuits operate asynchronously to the clock signal. However, the control signals designating an operation mode of the internal circuitry, i.e., row address strobe signal /RAS and column address strobe signal /CAS are applied from chip set CH to memory units MU1–MU4 in synchronization with clock signal CLK, and chip set CH samples the data in synchronization with this clock signal CLK. Therefore, it is necessary to optimize the set-up/hold times of data with respect to this clock signal. Referring to FIG. 19, the operation of chip set CH according to the fifth embodiment of the invention will now be conceptually described.

The memory unit selected by chip set CH out of memory units MU1–MU4 outputs the data in synchronization with clock signal CLK. This data is sent to chip set CH via data bus line DDBL.

Data bus DB transfers data of 64 bits, for example. Memory units MU1–MU4 transfer the data of 4 bits when selected. Chip set CH detects the data valid window based on the data of 64 bits. Accordingly, the data strobe timing is set commonly to 64 bits of the data.

Data Dc received by chip set CH has a pattern of H- and L levels according to the logical levels of the data bits, and provides a series of eye patterns varying in synchronization with the rising and falling of clock signal CLK.

In chip set CH, timing control circuit 105 produces a signal EDW_R defining the window period for data Dc, which is transmitted in synchronization with the rising of clock signal CLK, and a signal EDW_F indicating a valid period of data, which is transmitted in synchronization with the falling of clock signal CLK. By using these valid window defining signals EDW_R and EDW_F, the rising timing and falling timing of clock signal CLK are adjusted by times Tar and Taf, respectively, to produce the strobing clock signal, which can provide the optimum set-up and hold times.

The valid data window varies due to (1) a skew between data bits, (2) a difference between transition times of H- and L- level data bits, (3) interference noises between data lines, and (4) jitter of the outputting clock signal. However, the variations in valid window width due to jitter of the clock signal do not occur if memory units MU1–MU4 do not use a DLL (Delayed Locked Loop) for output, and output the data in synchronization with clock signal CLK.

For detecting the valid window, data bits 1, 0, 1, 0, . . . are output to data pins numbered 1, 2, 3, 4, . . . (data bus line numbers), respectively. This data pattern may be provided by setting the output data pattern of memory units MU1–MUn in the test mode, or may be provided by writing in advance such a data pattern in memory units MU1–MU4, and then reading out the data pattern thus written. Valid window indicating signals EDW_R and EDW_F are produced by detecting transition points in this data pattern, and the timing providing the optimum set-up/hold times for these valid windows is determined and stored in the registers. Thereafter, the strobe clock signals are produced for the respective memory units in accordance with the strobe timing stored in the registers.

Figure 20:
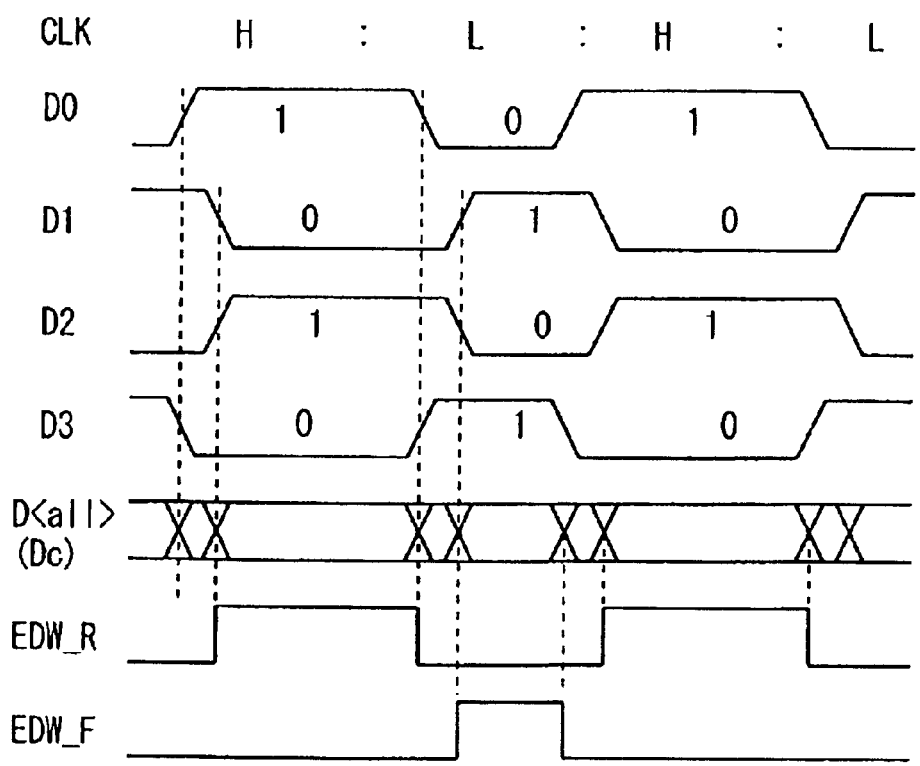
FIG. 20 is a signal waveform diagram illustrating a valid data window detecting operation in the fifth embodiment of the invention.

FIG. 20 conceptually shows an operation of extracting the valid data window signal. As shown in FIG. 20, data D0, D2, . . . , which are included in the data pattern output in synchronization with clock signal CLK and are output from even-numbered pin terminals (output nodes), are set at the same logical level as clock signal CLK, and data D1, D3, . . . output from odd-numbered pin terminals are set to the logical level opposite to that of clock signal CLK. In the DDR mode, the data reading is performed while using the rising edge of the clock signal as a leading edge. Therefore, the above data pattern is written in the memory chip, e.g., in the test mode, and thereafter, the data pattern thus written is successively read out. Alternatively, a register circuit or the like for storing data of "0101 . . ." or "1010 . . ." in the test mode may be arranged in an output stage of the memory chip, and the data stored in the register circuit may be read out instead of the memory cell data in the test mode. Registers storing "01" or "10" may be provided for respective data output pin terminals, and these contents may be successively and alternately read out in the test mode. FIG. 20 representatively illustrates data D0–D3 of 4 bits. When data of 64 bits is transferred via common data bus DB, the valid data window signals, which are detected for each four bits, are successively compressed to produce the valid data window signal for the data of 64 bits.

In FIG. 20, the pattern of data, which is transferred when clock signal CLK rises to H level, is known in advance. This data pattern is received, and the latest transition point is first detected from data bits D0–D3. Then, the fastest transition point is detected from data bits D0–D3. In accordance with the data pattern, which is transmitted when clock signal CLK rises, a period between the latest and fastest transition points is used as the valid data window of the data signal, which is transmitted in synchronization with the rising of clock signal CLK, and a signal EDW_R is kept active during this period.

When clock signal CLK falls, the data pattern to be transmitted is likewise known in advance. In this case, the latest and fastest transition points of the data bits are detected. The period between these points is extracted as the valid data window of the data, which is transmitted in synchronization with the falling of clock signal CLK, and valid data window signal EDW_F, which is active during this period, is produced. By predetermining the data bit patterns, which are transmitted in synchronization with the rising and falling edges of clock signal CLK, respectively, it is possible to produce valid window signal EDW_R for the data transmitted in synchronization with the rising edge of clock signal CLK as well as valid window signal EDW_F for the data transmitted in synchronization with the falling of clock signal CLK without difficulty.

Figure 21:
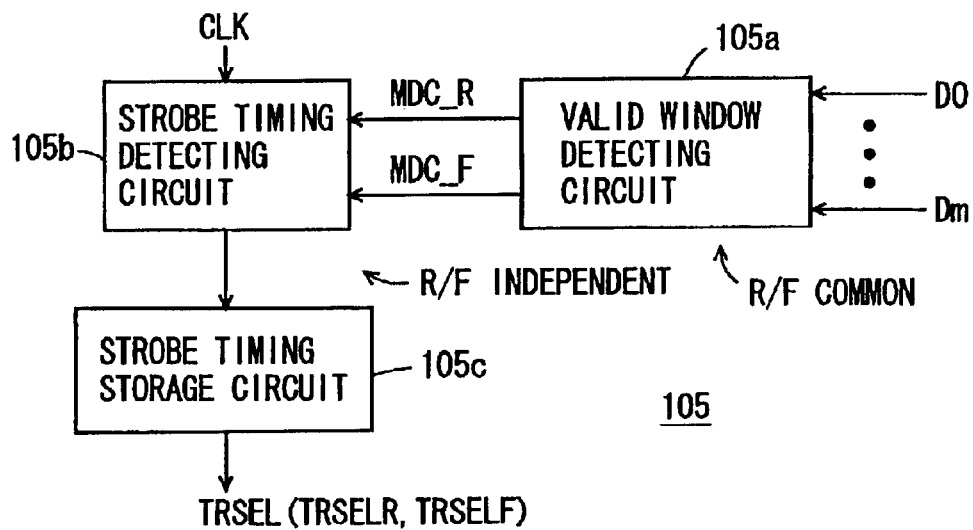
FIG. 21 schematically shows a structure of a timing control circuit shown in FIG. 18.

FIG. 21 conceptually shows a structure of timing control circuit 105. In FIG. 21, timing control circuit 105 includes: a valid window detecting circuit 105a which receives data bits D0–Dm, e.g., of 64 bits via common data bus DB, detects the valid windows for the rising and falling of clock signal CLK, and produces match detection signals (final valid data window detection signals) MDC_R and MDC_F indicating the valid windows thus detected, respectively; a strobe timing detecting circuit 105b for detecting the strobe timing for the data transferred in synchronization with the rising and falling edges of clock signal CLK, in accordance with the match detection signals MDC_R and MDC_F generated from valid window detecting circuit 105a and clock signal CLK; and a strobe timing storage circuit 105c which stores the strobe timing detected by strobe timing detecting circuit 105b, produces a data strobe trigger signal TRSEL to strobe clock generating circuit 106 shown in FIG. 18.

Strobe timing storage circuit 105c stores the strobe timings for the rising and falling edges for each of memory units MU1–MU4. If each of memory units MU1–MU4 is formed of a memory module including a plurality of memory chips, as is the case in the previous embodiments, strobe timing storage circuit 105c stores the strobe timing for each memory chip. Data strobe timing storage circuit 105c is formed of, e.g., register files, of which contents can be read out or written in accordance with an address signal.

Figure 22:
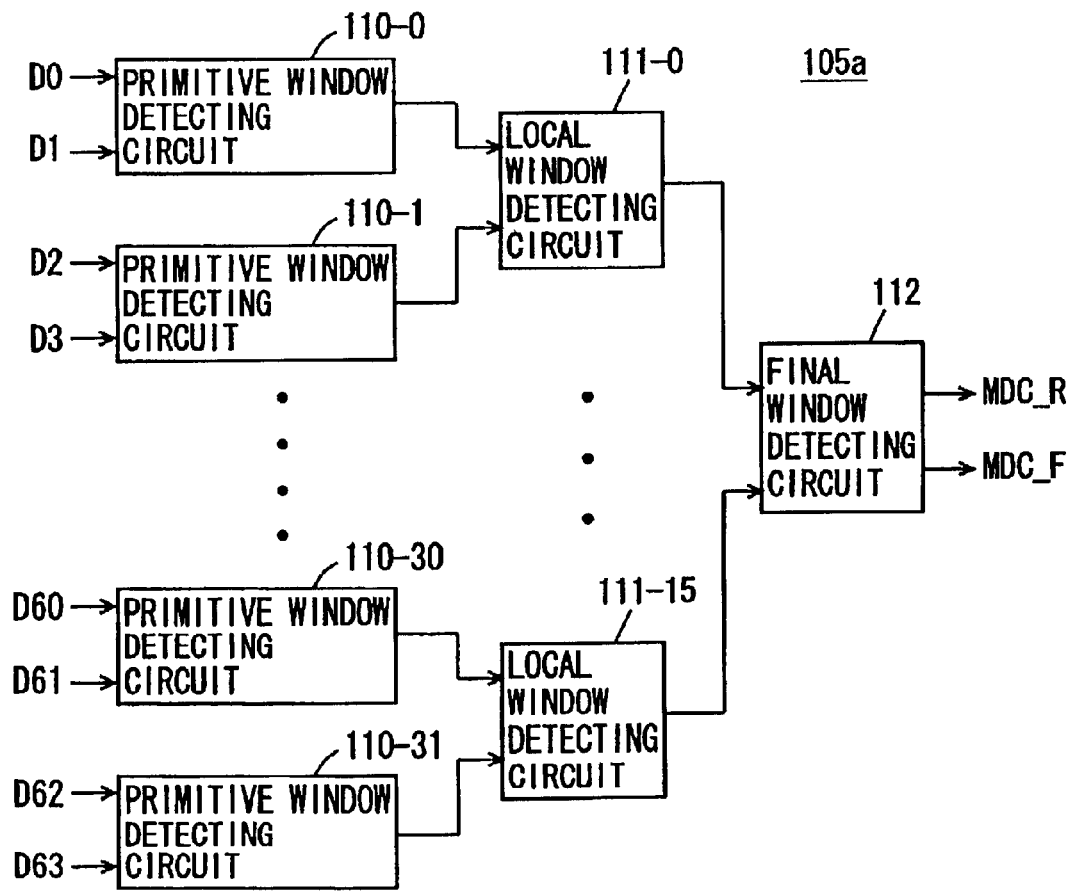
FIG. 22 schematically shows a structure of a valid window detecting circuit shown in FIG. 21.

FIG. 22 schematically shows a structure of valid window detecting circuit 105a shown in FIG. 21. As data transmitted via data bus DB, FIG. 22 shows data D0–D63 of 64 bits. In FIG. 22, valid window detecting circuit 105a includes: primitive window detecting circuits 110-0–110-31, which are provided corresponding to data sets each formed of data of two bits for detecting the valid windows of the corresponding data bits, respectively; local window detecting circuits 111-0–111-15, arranged corresponding to circuit pairs each formed of the adjacent two primitive detecting circuits, respectively, each for extracting a local window by detecting a period of matching of the primitive windows applied from the corresponding primitive window detecting circuits; and a final window detecting circuit 112 which produces final valid window detection signals (matching signals) MDC_R and MDC_F for the data of 64 bits in accordance with local window extracting signals generated from respective local window detecting circuits 111-0–111-15.

Primitive window detecting circuit 110-0 receives data bits D0 and D1, and primitive window detecting circuit 110-1 receives data bits D2 and D3. Primitive window detecting circuit 110-30 receives data bits D60 and D61, and primitive window detecting circuit 110-31 receives data bits D62 and D63. The data bit set applied to each of primitive window detecting circuits 110-0–110-31 is formed of complementary data bits. Thus, each of even-numbered data bits has the same logical level as clock signal CLK, and each of odd-numbered data bits has the logical level opposite to that of clock signal CLK.

By utilizing the pairs of such complementary data bits, the valid window can be easily detected as described below. In the normal operation, the data bits change in a random fashion. Therefore, by utilizing the pairs of complementary data bits for detecting the valid windows, the windows for providing optimum strobe timing can be detected as average values.

Each of these primitive window detecting circuits 110-1–110-31 detects the valid window of data, which is transferred in synchronization with the rising edge of clock signal CLK, as well as the valid window of data, which is transferred in synchronization with the falling edge of clock signal CLK.

Each of local window detecting circuits 111-0–111-15 detects the valid window for data of 4 bits. Thus, the valid window for the data of 4 bits is detected by detecting a matching region of the primitive windows each detected for the data of 2 bits. Each of local window detecting circuits 111-0–111-15 detects the valid windows of data transferred in synchronization with the rising and falling edges of clock signal CLK.

Final window detecting circuit 112 produces valid window detection signal (matching detection signal) MDC_R for the data transferred in synchronization with the rising edge of clock signal CLK, and the valid window detection signal MDC_F for the data transferred in synchronization with the falling edge of clock signal CLK, in accordance with the local window detection signals generated from local window detecting circuits 111-1–111-15.

FIG. 23 shows by way of example structures of the primitive and local window detecting circuits shown in FIG. 22. FIG. 23 representatively shows structures of primitive window detecting circuit 110-0 and local window detecting circuit 111-0 provided for data bits D0 and D1.

In FIG. 23, primitive window detecting circuit 110-0 includes a current mirror type circuit 110a for detecting the valid window of bits of the data transferred in synchronization with the falling edge of clock signal CLK, and a current mirror type circuit 110b for detecting the valid window of bits of the data transferred in synchronization with the rising edge of clock signal CLK.

Current mirror type circuit 110a includes a P-channel MOS transistor Q1 having a source coupled to a power supply node and receiving data bit D0 on its gate, P-channel MOS transistors Q2 and Q3 forming a current mirror stage supplied with a current from MOS transistor Q1, for supplying currents of the same magnitude, and N-channel MOS transistors Q4 and Q5 forming a differential stage for comparing data bit D1 with reference voltage Vref A drain of MOS transistor Q4 is connected to a drain and a gate of P-channel MOS transistor Q2.

From a connection node between MOS transistors Q3 and Q5, a primitive window signal ZN01 is generated for designating a valid window region of data bits D0 and D1 transferred in synchronization with the falling of clock signal CLK.

Current mirror type circuit 110b includes a P-channel MOS transistor Q6 having a source connected to a power supply node and receiving data bit D1 on its gate, P-channel MOS transistors Q7 and Q8 supplied with a current from MOS transistor Q6 to operate as a current mirror stage, and N-channel MOS transistors Q9 and Q10 connected between the ground node and MOS transistors Q7 and Q8, respectively, and forming a differential stage for comparing data bit D1 with reference voltage Vref. MOS transistor Q9 has a drain connected to a drain and gate of MOS transistor Q7, and receives data bit D0 on its gate. MOS transistor Q10 receives reference voltage Vref on its gate. From a connection node between MOS transistors Q8 and Q10, a primitive window signal N01 is generated for designating the valid window region of the data bits transferred in synchronization with the rising of clock signal CLK.

Local window detecting circuit 111-0 includes: a NAND circuit 111a which receives primitive window signal ZN01 generated from current mirror type circuit 110a and a primitive window signal ZN23 generated from primitive window detecting circuit 110-1 shown in FIG. 22 and produces a local window detection signal ZEDW_F03; and a NAND circuit 111b which receives primitive window signal N01 generated from current mirror type circuit 110b and a primitive window signal N23 generated from primitive window detecting circuit 110-1 shown in FIG. 22 and produces a local window detection signal ZEDW_R03.

Figure 24:
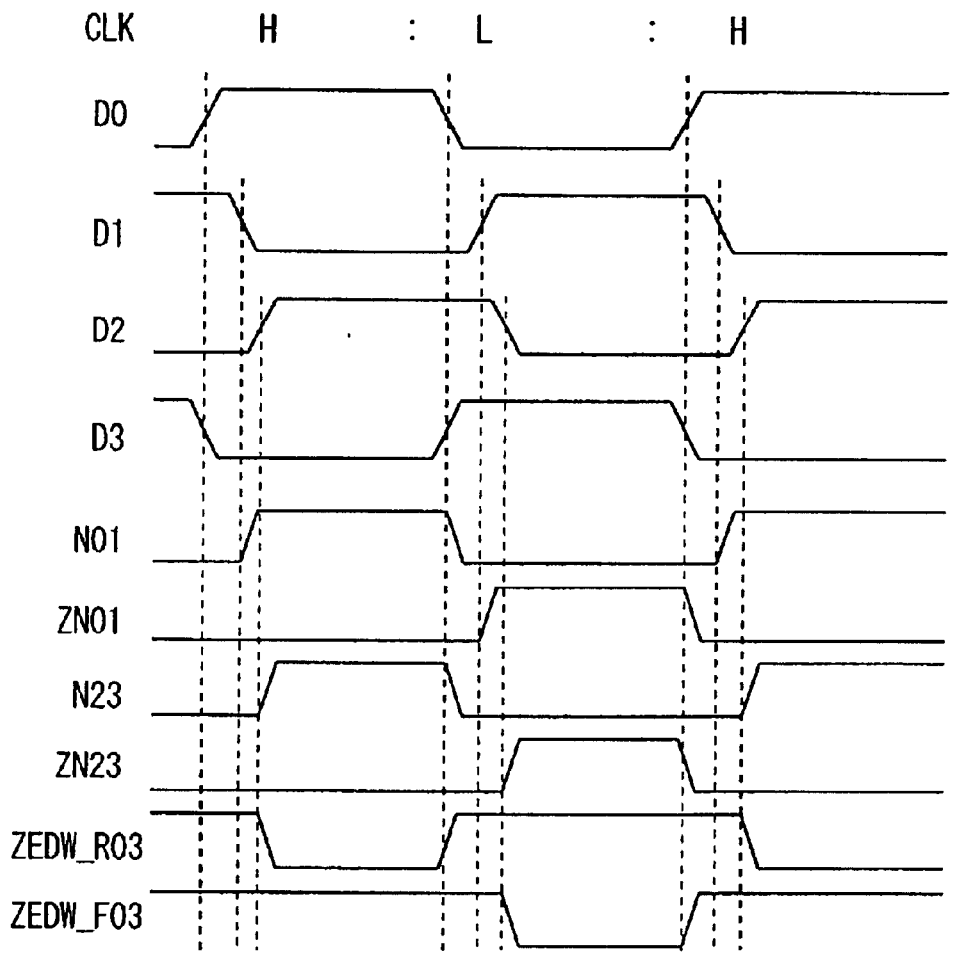
FIG. 24 is a signal waveform diagram illustrating an operation of the circuits shown in FIG. 23.

Local window detection signal ZEDW_F03 indicates the valid window region of data bits D0–D3 transferred in synchronization with the falling edge of clock signal CLK. Local window detection signal ZEDW_R03 indicates the valid window region of the data bits transferred in synchronization with the rising edge of clock signal CLK. Other primitive window detecting circuits 110-1–110-31 and local window detecting circuits 111-1–111-15 shown in FIG. 22 have structures similar to those shown in FIG. 23, but differ therefrom in the data bits and primitive window detection signals applied thereto. Description will now be given on the operations of primitive window detecting circuit 110-0 and local window detecting circuit 111-0 shown in FIG. 23 with reference to a signal waveform diagram of FIG. 24.

It is now assumed that data bits D0–D3 are transmitted in synchronization with the rising of clock signal CLK. For transferring the data, data bits D0 and D2 are set to the same logical level as clock signal CLK, and data bits D1 and D3 are at the logical level opposite to clock signal CLK. According to this data pattern, it is determined whether the data bits are transferred at the rising edge of clock signal CLK or the falling edge.

When data bit D0 rises, current mirror type circuit 110a is deactivated, and primitive window detection signal ZN01 maintains L level independently of the voltage level of data bit D1. While data bit D1 is at H level, current source transistor Q6 in current mirror type circuit 110b is off so that primitive window detection signal N01 is at L level. When data bit D0 rises to H level, and data bit D1 falls to L level, current source transistor Q6 in current mirror type circuit 110b is turned on, and current mirror type circuit 110b performs a comparing operation. Since data bit D0 is at a higher voltage level than reference voltage Vref, primitive window detection signal N01 rises to H level.

For data bits D2 and D3, the logical level of the primitive window detection signal is determined with data bits D0 and D1 in primitive window detecting circuit 110-0 shown in FIG. 23 replaced with data bits D2 and D3, respectively. When data bit D3 attains L level, current source transistor Q6 of current mirror type circuit 110b is turned on. When data bit D2 rises to H level, primitive window detection signal N23 rises to H level. Other primitive window detection signal ZN23 is at L level when data bit D3 is at L level. When data bit D2 rises to H level, current source transistor Q1 is turned off, and primitive window detection signal ZN23 maintains L level during the off state of current source transistor Q1.

When the data is transferred in synchronization with the falling edge of clock signal CLK, and data bit D0 falls to L level, the output signal of current mirror type circuit 110a is at L level. Primitive window detection signal ZN01 rises to H level in response to the rising of data bit D1 from L level to H level. When data bit D1 s at L level, data bit D0 falls to L level, and primitive window detection signal N01 falls to L level. When data bit D0 falls to level L and data bit D1 rises to H level, current source transistor Q6 in current mirror type circuit 110b is turned off, and primitive window detection signal N01 maintains L level.

For data bits D2 and D3, current source transistor Q6 is turned off when data bit D3 rises to H level, and primitive window detection signal N23 falls to L level. In current mirror type circuit 110a, current source transistor Q1 is still off as long as data bit D2 is at H level even after data bit D3 rises to H level, and primitive window detection signal ZN23 maintains L level. When data bit D2 falls to L level, current source transistor Q1 is turned on. Since data bit D3 is at H level, primitive window detection signal ZN23 rises to H level in response.

When data bit D0 rises to H level, current source transistor Q1 is turned off, and primitive window detection signal ZN01 falls to L level. Primitive window detection signal ZN23 is likewise falls to L level by the differential amplifying operation of current mirror type circuit 110a when data bit D3 attains L level.

Local window detection signal ZEDW_R03 is at L level when both primitive window detection signals N01 and N23 are at H level. Local window detection signal ZEDW_F03 is at L level when both primitive window detection signals ZN01 and ZN23 are at H level.

The primitive window detection signals each rise in response to the latest transition in associated data bits, and falls to L level in response to the earliest transition in associated data bits. Likewise, primitive window detection signals ZN01 and ZN23 each rise to H level in response to the latest transition in associated data bits, and fall to L level of the inactive state in response to the latest transition in associated data bits. Therefore, by combining these primitive window detection signals by NAND circuits 111a and 111b, window detection signals ZEDW_F03 and ZEDW_R03 can be held active, or at L level only while all the four bits of data D0–D3 are in the definite state.

The local window detecting operation as described above is executed on the transferred data bits by the circuitry handling four bits as one unit, and the respective local valid windows are detected.

Figure 25:
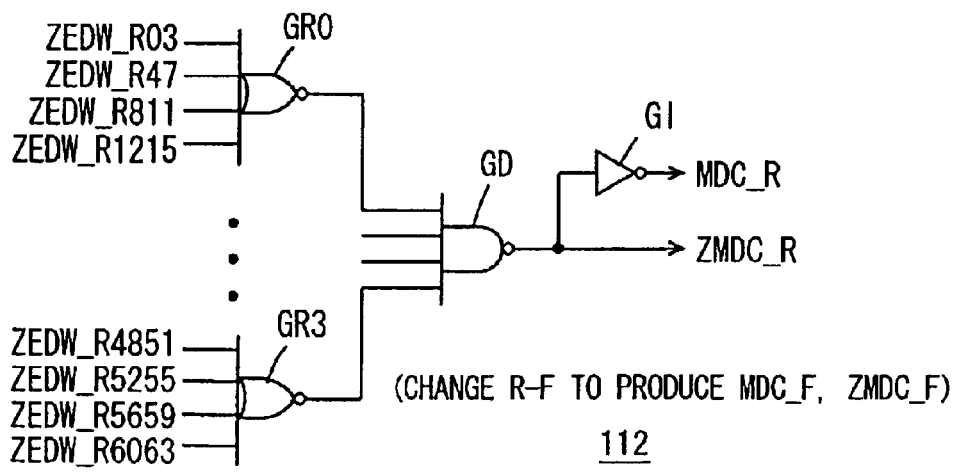
FIG. 25 shows a structure of a final window detecting circuit shown in FIG. 22.

FIG. 25 shows a structure of a portion for generating final valid window detection signal (match detection signal)

MDC_R in final window detecting circuit 112 shown in FIG. 22. FIG. 25 shows a structure of the valid data window detecting circuit for data bits D0–D63. The transfer data is formed of 64 bits, and sixteen local valid data window detection signals ZEDW_R03–ZEDW_R6063 are produced. With four local valid data window detection signals being a set, NOR gates GR0–GR3 are provided for the respective sets. Specifically, NOR gate GR0 receives local window detection signals ZEDW_R03–ZEDW_R15 for data bits D0–D15. NOR gate GR3 receives local window detection signals ZEDW_R4851–ZEDW_R6063 for data bits D48–D63.

Final window detecting circuit 112 further includes a four-input NAND gate GD receiving the output signals of NOR gates GR0–GR3, and an inverter GI for inverting the output signal of NAND gate GD. NAND gate GD produces final valid window detection signal ZMDC_R, and inverter GI produces final valid data window detection signal MDC_R.

Each of NOR gates GR0–GR3 outputs a signal at H level when all the received local window detection signals attain L level. Accordingly, NOR gate GR0 generates a signal indicating the valid window region, and NOR gate GR3 generates a signal indicating the valid window region of data bits D48–D63.

NAND gate GD outputs a signal at L level when all the received signals are at H level. Therefore, final valid data window detection signal ZMDC_R generated from NAND gate GD indicates the valid data window region of data bits D0–D63.

In the structure shown in FIG. 25, when the signal ZEDW_F is used as the local window detection signal, the signals ZMDC_F and MDC_F are generated, which indicates the final valid data window for the data transferred in synchronization with the falling edge of clock signal CLK. By using these final valid data window detection signals, it is possible to extract the valid data window region of the applied data bits. For the valid data window region thus extracted, the phase of clock signal CLK is adjusted, to produce the clock signal for the strobe such that the set-up/hold times can be optimum with respect to the received data.

Figure 26:
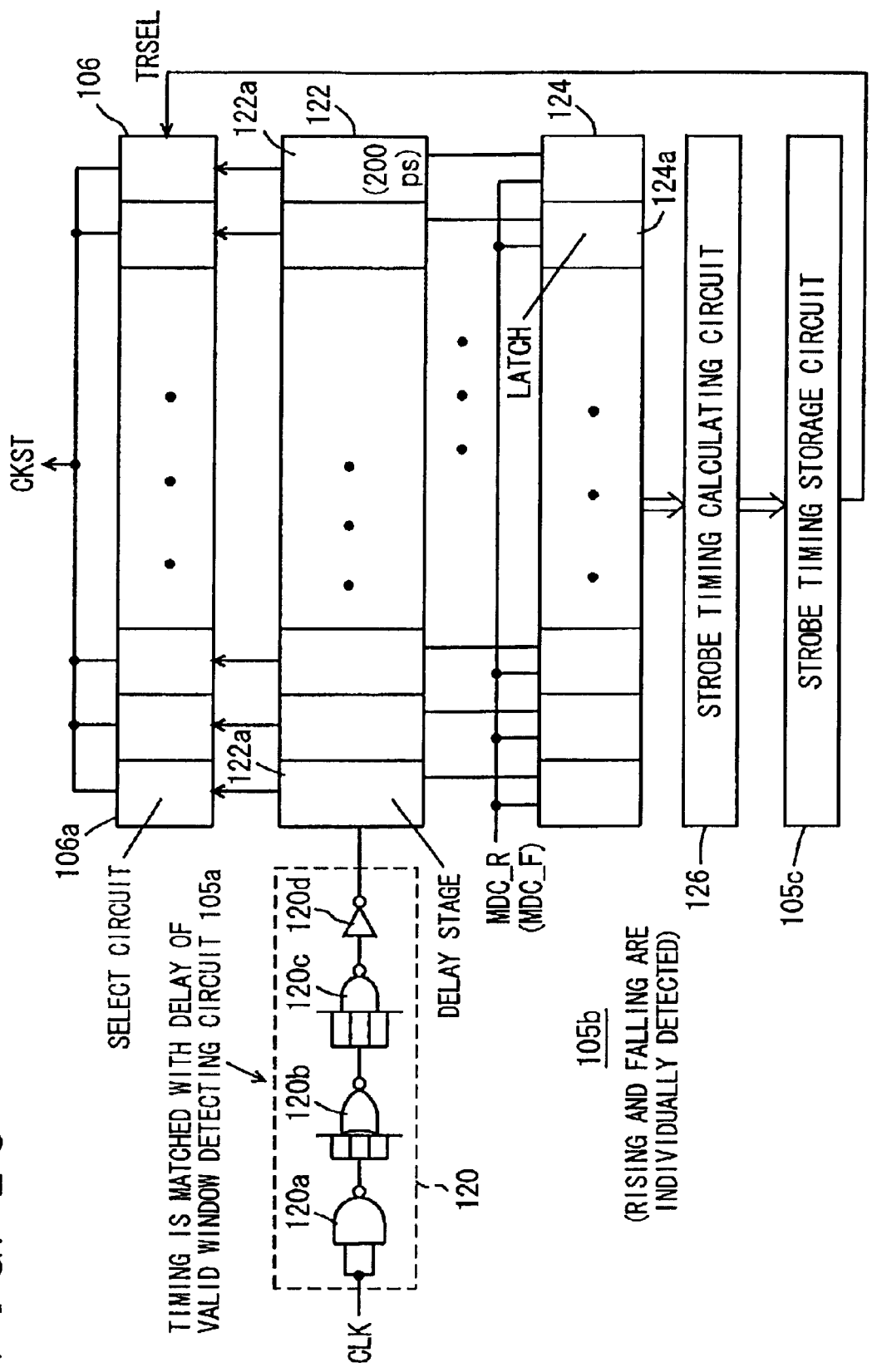
FIG. 26 schematically shows a structure of a strobe timing detecting circuit shown in FIG. 21.

FIG. 26 schematically shows a structure of strobe timing detecting circuit 105b shown in FIG. 21. In FIG. 26, strobe timing detecting circuit 105b includes a timing adjusting circuit 120 for adjusting timing of clock signal CLK in accordance with a signal propagation delay of valid window detecting circuit 105a, a delay line 122 having cascaded delay stages 122a each having a delay time, e.g., of 200 ps for successively delaying the clock signal received from timing adjusting circuit 120, a result register circuit 124 including latch circuits 124b arranged corresponding to the respective delay stages 122a of delay line 122 and comparing the phases between final valid data window detection signal MDC_R (or MDC_F) and the output signals of the respective delay stages 122a of delay line 122, and latching the results of the comparison, and a strobe timing calculating circuit 126 for calculating the strobe timing in accordance with the respective signals stored in latch circuits 124a. The strobe timing calculated by this strobe timing calculating circuit 126 is stored in strobe timing storage circuit 105c.

Strobe clock generating circuit 106 shown in FIG. 18 includes select circuits 106a arranged corresponding to respective delay stages 122a of delay line 122 as shown in FIG. 26. The strobe clock signal CKST is produced, by selecting an input clock signal of a corresponding delay stage 122a of the delay line 122, in accordance with a data trigger select signal TRSEL produced based on the strobe timing information stored in strobe timing storage circuit 105c.

Figure 27:
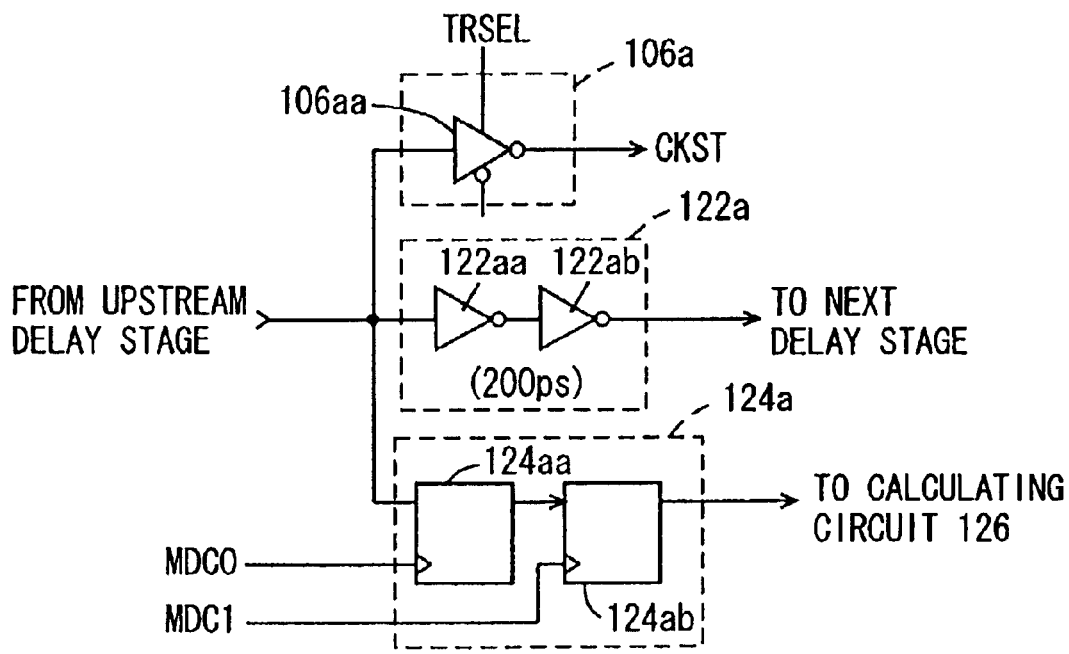
FIG. 27 shows structures of a delay line, a clock select circuit and a latch circuit in one stage.

FIG. 27 shows by way of example structures of select circuit 106a included in strobe clock generating circuit 106 and latch stage 124a of latch circuit 124. In FIG. 27, delay stage 122a includes delay inverter circuits 122aa and 122ab of an even number of stages (two stages in FIG. 27), for delaying the clock signal applied from the upstream delay stage. Delay stage 122a has a delay time, e.g., of 200 ps.

Latch stage 124a includes a latch 124aa for latching an input clock signal of a corresponding delay stage 122a in response to a latch instructing signal MC0, and a latch 124ab for latching the latch output of latch 124aa and applying it to strobe timing calculating circuit 26 in response to transfer instructing signal MDC1. In latch stage 124a, transfer instructing signals MDC0 and MDC1 are alternately produced in response to final valid data window detection signal MDC_R (or MDC_F), and latch 124aa detects the position of the valid data window. Then, the valid window position thus detected is transferred to calculating circuit 126 via latch 124ab.

Select circuit 106a includes a tri-state inverter circuit 106aa producing strobe clock signal CKST by inverting the input clock signal of delay stage 122a in response to data trigger select signal TRSEL received from strobe timing storage circuit 105c. Strobe clock signal CKST is produced by tri-state inverter buffer circuit 106aa for such a reason that the corresponding sampling circuit (latch circuit) enters the latch state in synchronization with the falling of the clock signal (strobe clock signal). The output of select circuit 106aa is wired together.

Figure 28:
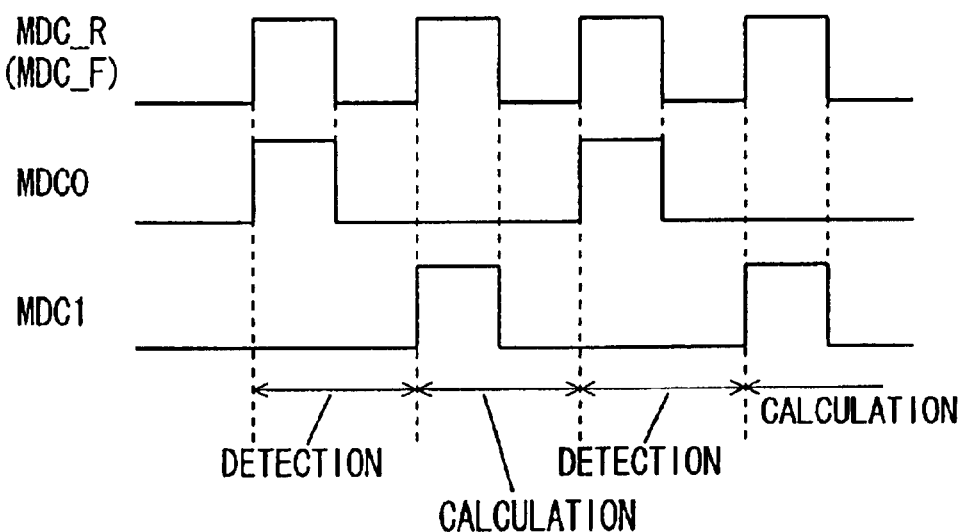
FIG. 28 is a timing chart illustrating an operation of the circuits shown in FIG. 27.

FIG. 28 illustrates generating timing of the signals MDC0 and MDC1 defining the latch timing of latch stage 124a shown in FIG. 27. As shown in FIG. 28, latch instructing signal MDC0 is produced in response to final valid data window detection signal MDC_R (or MDC_F). Transfer instructing signal MDC1 is produced in accordance with each second final valid data window detection signal MDC_R (or MDC_F). According to this latch instructing signal MDC0, delay stage 124a latches the output signal of the upstream delay stage, and the position of the valid data window is detected. Then, the output signal of latch 124aa is transferred to latch 124ab in accordance with transfer instructing signal MDC1. Strobe timing calculating circuit 126 performs the calculation based on the received output signal of the latch circuit 124ab to determine the optimum strobe timing.

Figure 29A:
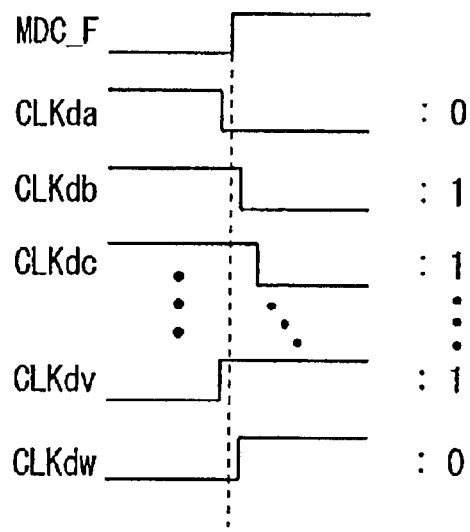
FIGS. 29A and 29B are signal waveform diagrams representing an operation of the strobe timing detecting circuit shown in FIG. 26.

FIG. 29A is a waveform diagram showing a timing relationship between final valid data window detection signal MDC_F and the delay line input clock signals. Input signals CLKda–CLKdw of the delay stages have phases shifted from each other by a unit time, e.g., of 200 ps. It is now assumed that final valid data window detection signal MDC_F rises between falling edges of delayed clock signals CLKda and CLKdb. In this case, latch stage 124a shown in FIG. 27 enters the latch state in synchronization with the rising of final valid data window detection signal MDC_F, and the corresponding delayed clock signal is taken in and latched. Accordingly, latch stage 124a corresponding to delayed clock signal CLKda latches "0", and latch stages 124a corresponding to respective delayed clock signals CLKdb–CLKdv store "1" because the corresponding delayed clock signals are at H level.

Figure 29B:
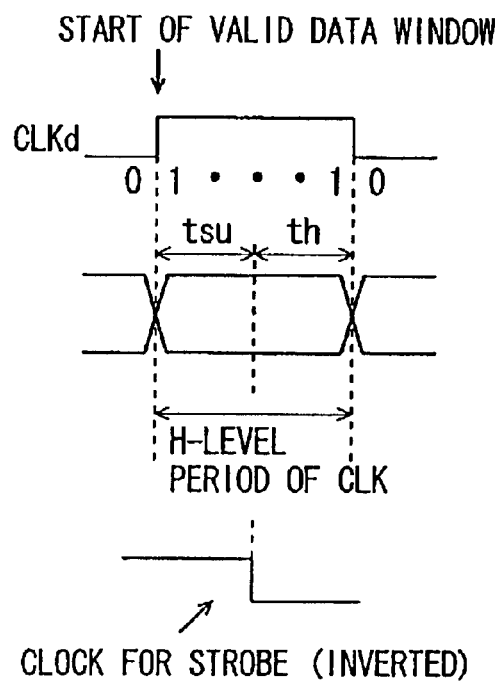

The number of these latch stages storing "1" corresponds to the valid window of the period of H level of clock signal CLK(CLKd), as shown in FIG. 29B. A phase shift between the start of the valid data window and clock signal CLK is detected, and the strobe timing is determined to provide optimum set-up time, tsu, and optimum hold time, th. It is assumed that the number of the latch stages storing "1" corresponds to the H level period of clock signal CLK and therefore to L level period (assuming that clock signal CLK has a duty ratio of 50%), and that the valid data window width corresponds to this H level period of the clock signal. Based on the above assumption, the strobe timing is determined such that select circuit corresponding to the latch stage in the central position among the latch stages storing "1" is activated. The operation of determining such strobe timing will be described later in detail.

Figure 30A:
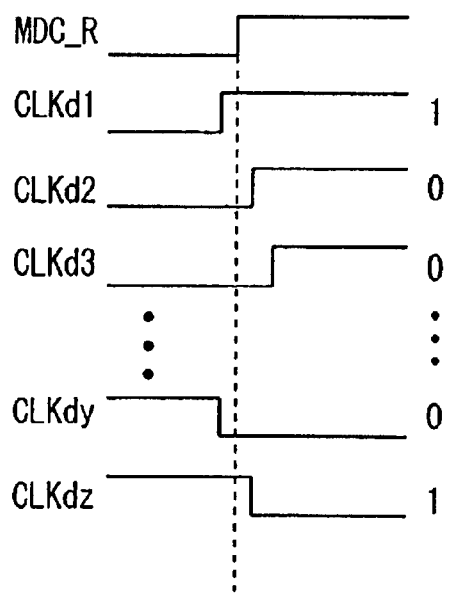
FIGS. 30A and 30B are signal waveform diagrams representing an operation of the strobe timing detecting circuit shown in FIG. 26.

FIG. 30A illustrates a timing relationship between final valid data window detection signal MDC_R and the delayed clock signals. Delay line 122 outputs delayed clock signals CLKd1–CLKdz. It is assumed that the final valid data window detection signal MDC_R rises to H level at a time point between rising time points of delayed clock signals CLKd1 and CLKd2. In this case, the rising of delayed clock signal of each delay stage on delay line 122 is delayed from that of the upstream delay stage. Therefore, latch stage 122a provided corresponding to delayed clock signal CLKd1 stores "1", and latch stages 124a corresponding to clock signals CLKd2–CLKdy store "0". Latch stage 124a provided corresponding to clock signal CLKdz stores "1".

Figure 30B:
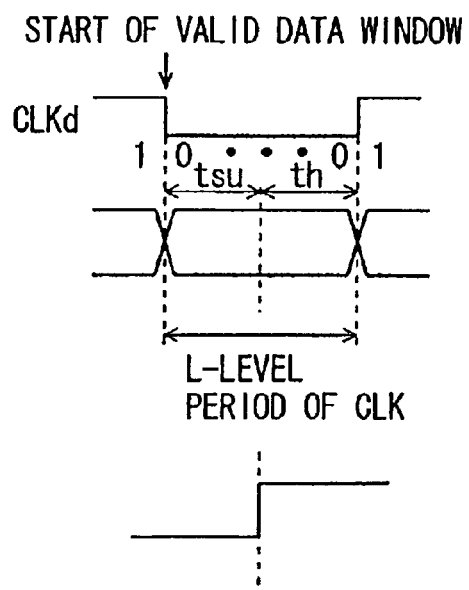

In this case, therefore, the number of latch stages storing "0" corresponds to the period of L level of delayed clock signal CLKd, as illustrated in FIG. 30B. In this case, the period of L level of clock signal CLK is uniquely determined in the memory system after assembly on a board. In view of the above period, the data strobe timing is determined to provide optimum set-up time, tsu, and optimum hold time, th.

Figure 31:
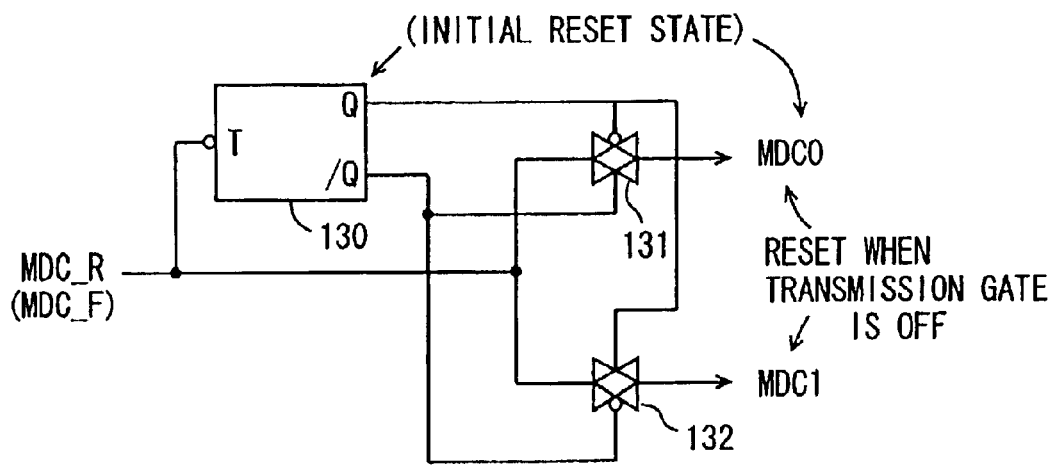
FIG. 31 schematically shows a structure of a portion for generating a latch timing signal shown in FIG. 27.

FIG. 31 shows by way of example a structure of the portion for generating latch instructing signal MDC0 and transfer instructing signal MDC1 shown in FIG. 27. In FIG. 31, the instructing signal generating portion includes a T-flip-flop 130 having an output state changed in response to the falling of final valid data window detection signal MDC_R (or MDC_F), a transmission gate 131 rendered conductive in accordance with complementary signals generated from outputs Q and /Q of T-flip-flop 130, for producing latch indicating signal MDC0 from final valid data window detection signal MDC_R (or MDC_F) when conductive, and a transmission gate 132 rendered conductive complementarily to transmission gate 131 in accordance with complementary output signals of T-flip-flop 130, for producing transfer instructing signal MDC1 by passing final valid data window detection signal MDC_R (or MDC_F) when conductive.

T-flip-flop 130 is initially in a reset state so that a signal generated from its output Q is at L level. Therefore, latch instructing signal MDC0 is first produced in accordance with final valid data window detection signal MDC_R (or MDC_F). When final valid data window detection signal MDC_R (or MDC_F) falls, the state of the output signal of T-flip-flop 130 changes, and transfer instructing signal MDC1 is produced in accordance with final valid data window detection signal MDC_R (or MDC_F). Thereby, the phase information taken into latch stages 122a can be successively transferred.

Transmission gates 131 and 132 are in an output high impedance state in an off state. For reliably performing the initialization, MOS transistors for resetting are provided for resetting the instructing signals MDC0 and MDC1 to the ground voltage level when corresponding transmission gates 131 and 132 are off.

Figure 32:
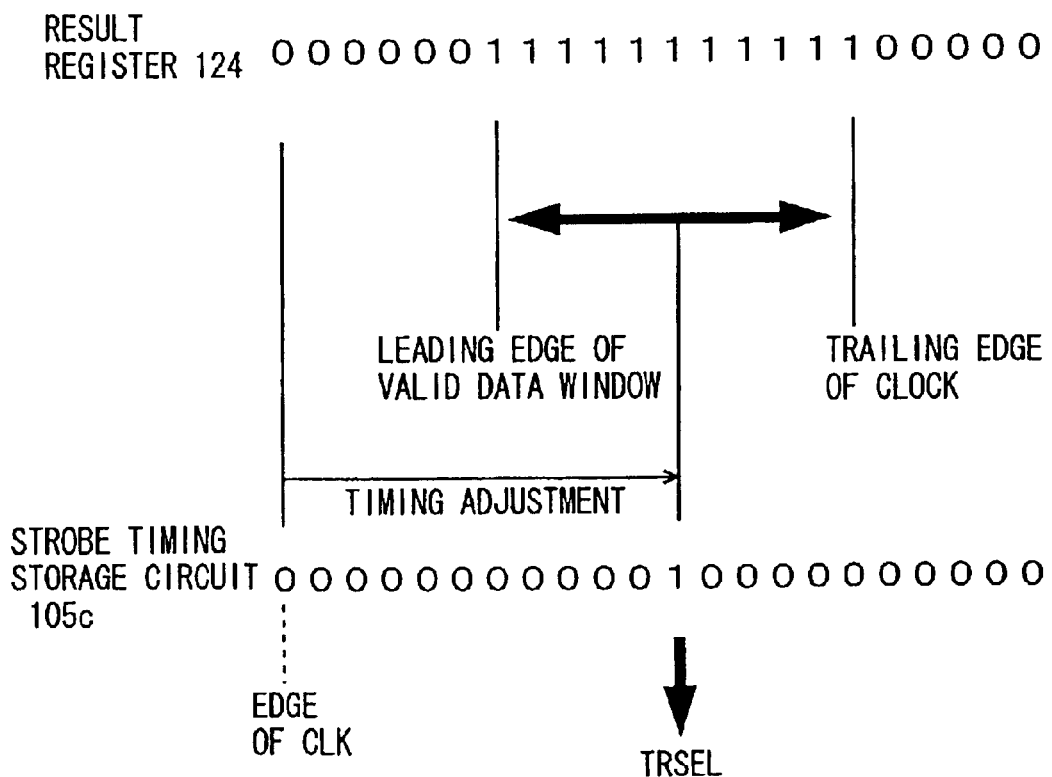
FIG. 32 illustrates by way of example contents stored in a result register and a strobe timing storage circuit.

FIG. 32 conceptually shows a calculating operation of strobe timing calculating circuit 126 shown in FIG. 26. In FIG. 32, result register circuit 124 has stored the position of the leading edge of the final valid data window detection signal on the basis of the corresponding edge (rising or falling edge) of clock signal CLK. Thus, in result register circuit 124, the position where a change from "0" to "1" occurs is the position of the leading edge of the valid data window. In the data stored in result register circuit 124, the position where a change from "1" to "0" occurs is the position of the trailing edge of the clock signal corresponding to this valid data window.

When the valid data window is substantially equal to half the cycle of clock signal CLK (i.e., when the data transfer is performed in the DDR mode), the region successively covering "1" corresponds to a period, for which the definite data bits are transferred. A central position of the latch stages storing "1" in result register circuit 124 is detected, and is stored in strobe timing storage circuit 105c. When the valid data region is substantially equal to half the cycle of clock signal CLK, the central region of the valid window is decided, whereby it is possible to make the set-up time and the hold time equal to each other, and to maximize margins for the set-up and hold times.

The register in the bit position stored in strobe timing storage circuit 105c outputs data trigger select signal TRSEL. In accordance with data trigger select signal TRSEL, select circuit 106a shown in FIG. 27 turned conductive, and strobe clock signal CKST is produced by selecting the delayed clock signal corresponding to the register position stored in strobe timing storage circuit 105c. The strobe clock signal CKST has an edge that changes substantially at a central region of the valid data window, and the corresponding valid data bit can be sampled.

Figure 33:
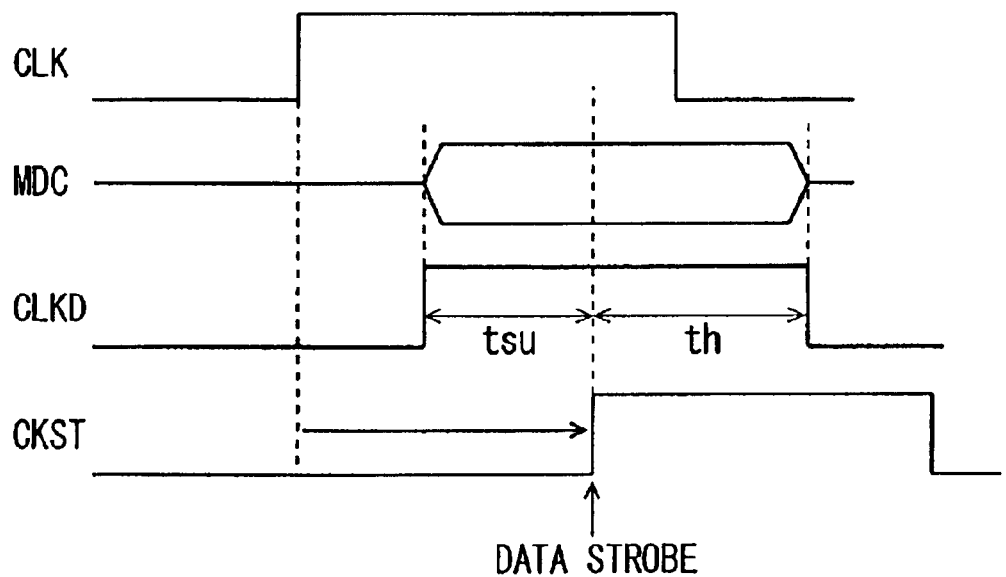
FIG. 33 illustrates a timing relationship between a valid data window and a strobe clock signal.

More specifically, when the position of final valid data window detection signal MDC_R (or MDC_F) is shifted with respect to clock signal CLK as shown in FIG. 33, the position of the clock signal, which changes in the same position as the leading edge of final valid data window detection signal MDC, is detected. However, an error is present within the delay time (e.g., 200 ps) of delay stage 122a. The detected window of the clock signal is indicated by "CLKD". The position of the clock signal window CLKD is stored in result register circuit 124. The strobe timing is calculated such that the edge exists at the central position of clock signal window CLKD, and data trigger select signal TRSEL is produced. Strobe clock signal CKST has an active period (H level) substantially equal to the valid data window width, and the data strobe can be performed substantially at a central region of the valid data window so that the margins for set-up time, tsu, and hold time, th can be maximized.

Figure 34:
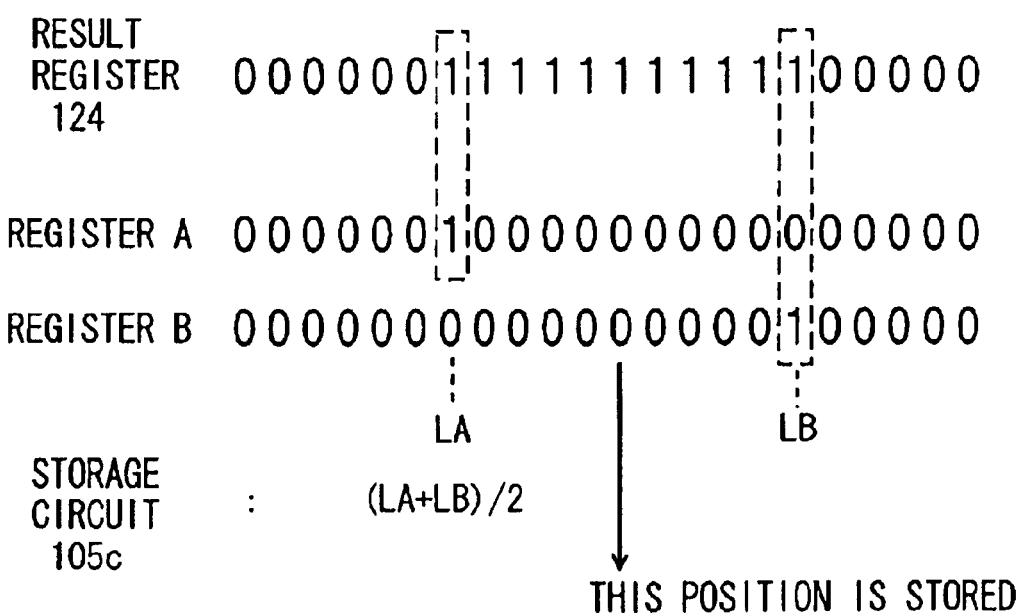
FIG. 34 illustrates a principle of an operation of determining a strobe timing.

FIG. 34 illustrates a specific manner of calculating the strobe timing. Numbers are assigned to the latch stages of the result register circuit, respectively. It is assumed that "1" is stored in and between latches LA and LB. Register A stores a number LA of latch LA, and register B stores a number LB of the last latch storing "1". The strobe timing can be determined from an average value of (LA+LB)/2 based on these latch numbers LA and LB. The register number (i.e., selected circuit) having this strobe timing used is stored in storage circuit 105c.

For these registers A and B, the leading and trailing end positions of "1" may be stored with hardware, as will be described below. The output signals of the adjacent latches of result register 124 are detected, and the transition point of "01" and transition point "10" are detected. Thus, the leading and trailing end positions of the storage window stored in registers A and B, i.e., the numbers of the leading and trailing latches can be detected. Registers A and B are required to have register circuits equal in number to the latch stages of result register circuit 124. Also, the gate circuits for detecting the set of "01" and the gate circuits for detecting the set of "10" are required.

For reducing the number of components, such a structure may be employed that a controller (not shown) determines the numbers of latches storing "1" in result register circuit 124, and the detected latch numbers are stored in registers A and B for detecting the strobe timing. Strobe timing storage circuit 105c must store the strobe timing for each of banks (memory chips) of the memory units, and the structure for controlling the strobe number storing operation may be configured to also perform the operation of calculating the values to be stored in registers A and B.

Figure 35A:
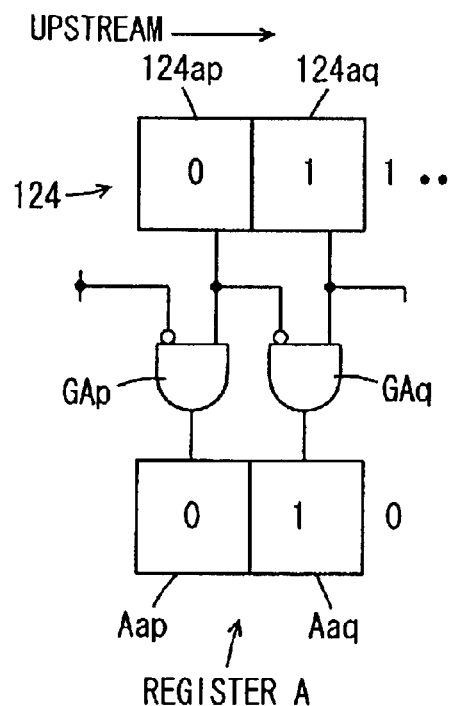
FIG. 35A shows by way of example a structure of a storage control portion for a register A.
Figure 35B:
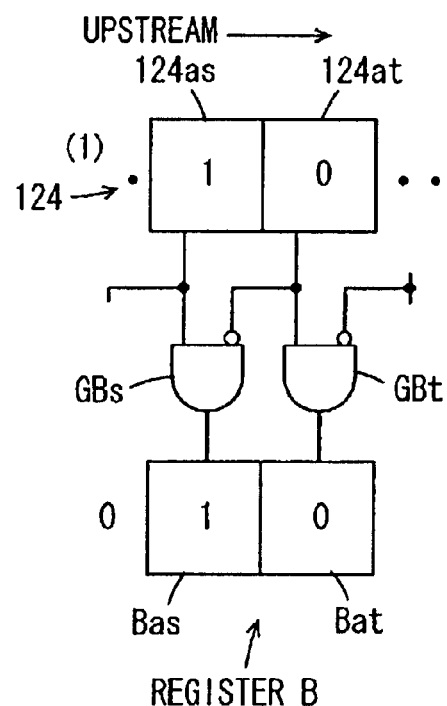
FIG. 35B illustrates by way of example a storage control portion for a register B.

FIGS. 35A and 35B schematically show a structure of a data storage control portion for registers A and B.

In FIG. 35A, result register circuit 124 includes latch stages 124ap and 124aq. These latch stages 122ap and 122aq are arranged corresponding to successive delay stages. Gate circuits GAp and GAq are provided corresponding to latch stages 124ap and 124aq, respectively. The output signals of gate circuits GAp and GAq are applied to corresponding register circuits Aap and Aaq of register A, and are stored therein, respectively.

Gate circuit GAp receives the latch signal of corresponding latch stage 122ap and an inverted signal of the output signal of the upstream adjacent latch stage. When both the received signals are "1", gate circuit GAp generates a signal of "1". Gate circuit GAq receives the inverted signal of the output signal of latch stage 122ap and the output signal of corresponding latch stage 124aq. Therefore, when latch stages 122ap and 122aq store "0" and "1", respectively, as shown in FIG. 35A, the output signal of gate circuit GAp attains L level ("0"), and only the output signal of gate circuit GAq attains "1". Therefore, the leading edge of the final valid data window can be detected, to store the position of the leading edge in the register A.

In FIG. 35B, gate circuits GBs and GBt are arranged for latch stages 124as and 124at of register circuit 124, respectively. Register circuits Bas and Bat are arranged in register B for receiving the output signals of gate circuits GBs and GBt, respectively. Gate circuit GBt receives the output signal of corresponding latch stage 124at and an inverted signal of the output signal of the downstream adjacent latch stage. Gate circuits GBs outputs a signal of "1" when latch stages 124as and 124at store "1" and "0", respectively. Gate circuit GBt outputs a signal of "0" when the output signal of latch stage 124at is "0". By utilizing the structure shown in FIG. 35B, the trailing edge of the final valid data window region can be detected, to store the detected position in register B.

A control unit (not shown) detects the numbers of registers (latch numbers) storing "1" in registers A and B, detects the strobe timing from the detected register numbers, and writes "1" into the register in strobe timing storage circuit 105c.

Figure 36:
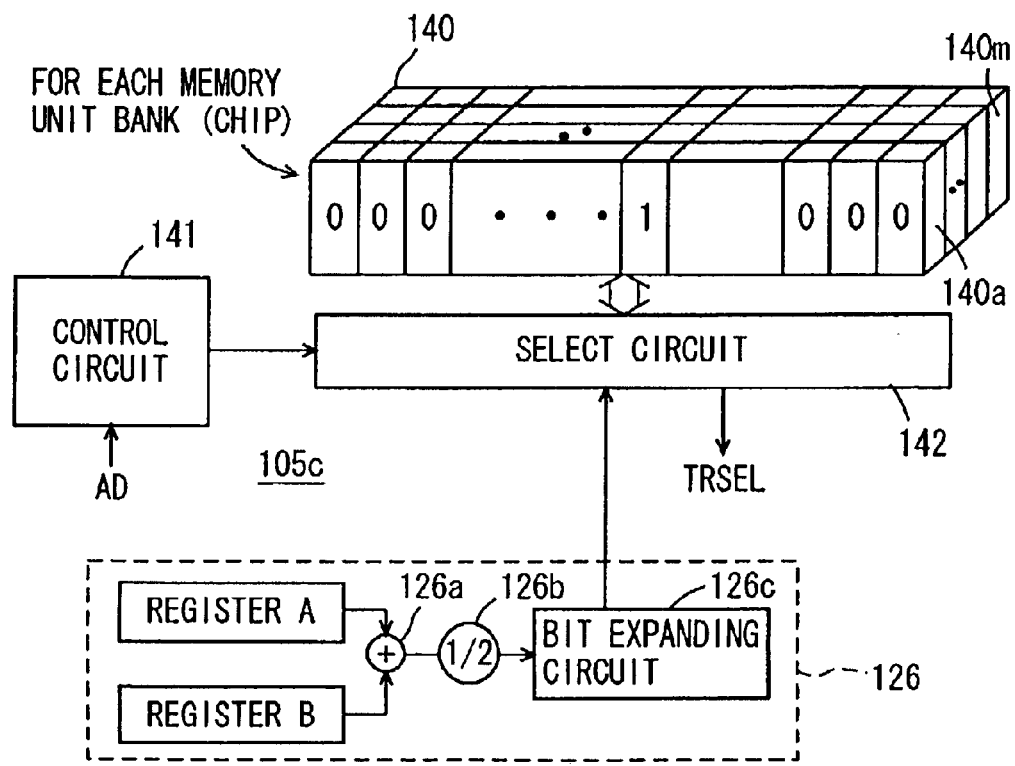
FIG. 36 schematically shows a structure of a strobe timing storage circuit shown in FIG. 26.

FIG. 36 shows by way of example the structures of strobe timing calculating circuit 126 and strobe timing storage circuit 105c. In FIG. 36, strobe timing calculating circuit 126 includes an adder 126a for adding the leading latch number stored in register A and the trailing latch number stored in register B, a multiplier 126b multiplying an output value of adder 126a by ½, and a bit expanding circuit 126c for expanding bits of the output value of multiplier 126b depending on the number of delay stages of delay line 122.

Registers A and B store the numbers of the latches corresponding to the leading and trailing edge positions of the pulse width of the clock signal matching with the leading and trailing edges of the final valid data window, respectively. Adder 126a adds these latch numbers, and multiplier 126b multiplies the sum obtained by a factor of ½. Thereby, the number of latch stage, which corresponds to the clock signal having the edge at the central position between the leading and trailing edges of the valid window, is detected.

Bit expanding circuit 126c sets "1" in the register circuit corresponding to the latch number obtained by the multiplier 126b, and stores "0" in all the other register circuits. Thus, it is possible to produce the select control signals corresponding to the respective clock selecting circuits, which in turn are provided corresponding to the delay stages of delay line 122, respectively.

Strobe timing storage circuit 105c includes a register circuit 140 including registers 140a–140m provided corresponding to the respective memory units and banks (memory chips), a select circuit 142 for selecting a register from this register circuit 140, and a control circuit 141 for controlling the selecting operation of select circuit 142 in accordance with address signal AD. Each of registers 140a–140m has a bit width equal to the bit width of data generated from bit expanding circuit 126c. Select circuit 142 selects one register, and the data applied from bit expanding circuit 126c is written into the selected register. Thereby, the signal indicating the delayed clock select position for a bank (memory chip) of a memory unit is stored. If each memory chip has a multi-bank structure, strobe timing information for each of the banks in the memory chip is extracted and stored.

In the normal operation, control circuit 141 selects, in accordance with address AD specifying a memory unit and a bank (memory chip), a corresponding register in register circuit 140 by select circuit 142. This select circuit 142 produces data trigger select signals TRSEL, in which only one bit is "1" and the other bits are "0", and these bits are applied in parallel to select circuits 106a of strobe clock generating circuit 106, respectively.

Registers A and B store the numbers of the corresponding latch stages in the positions of register circuits of "1" stored in registers A and B, respectively, as shown in FIG. 36.

[Modification of Strobe Timing Storage Circuit 105c]

Figure 37:
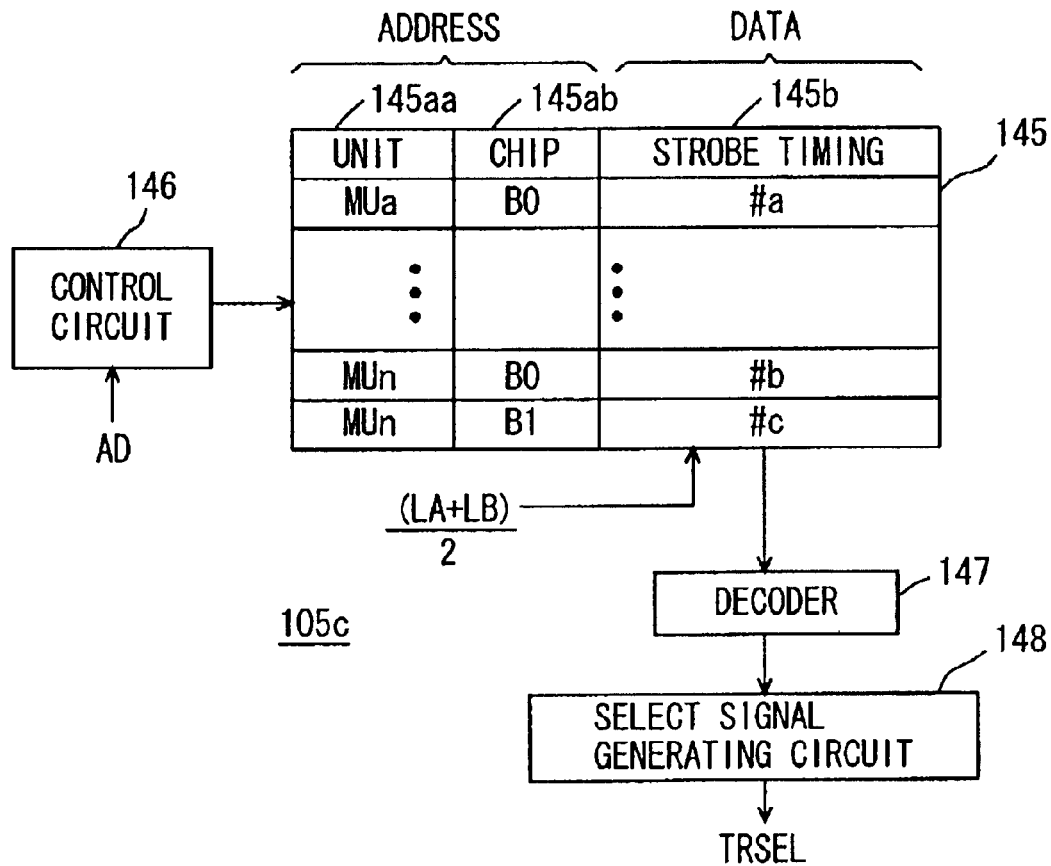
FIG. 37 shows another structure of the strobe timing storage circuit shown in FIG. 26.

FIG. 37 shows a modification of strobe timing storage circuit 105c.

In FIG. 37, strobe timing storage circuit 105c includes a register circuit 145 for storing strobe timing corresponding to the memory units and memory chips (or banks), a control circuit 146 for controlling writing and reading to register circuit 145, a decoder 147 for decoding the strobe timing information read from register circuit 145, and a select signal generating circuit 148 for producing data trigger select signal TRSEL in accordance with the decoded signal received from decoder 147.

Register circuit 145 stores a memory unit name 145aa, a memory chip name (or bank name) 145ab and strobe timing information 145b in a linked form.

Memory unit name 145aa designates a plurality of memory units simultaneously selected, and memory chip name 145ab specifies the memory chip names simultaneously designated. When the memory chip has a bank structure, the strobe timing information is stored for each bank of the memory chip.

Memory unit name 145aa and memory chip name (bank name) 145ab may be utilized as an address for storing a corresponding strobe timing (the number of latch stage). Register circuit 145 may be formed of a content addressable memory (CAM), to read the strobe timing information with memory unit name 145aa and memory chip name (bank name) 145ab being a reference address.

In FIG. 37, a memory chip (bank) B0 of memory unit name MUa stores strobe timing information #a. In the example shown in FIG. 37, strobe timing #b and strobe timing #c are stored corresponding to memory chips (banks) B0 and B1 of memory unit name MUn. Strobe timing information 145b merely stores the number, (LA+LB)/2, of the latch stage.

Decoder 147 decodes the strobe timing information read from register circuit 145, and produces a signal specifying a corresponding clock select circuit. Select signal generating circuit 148 latches the output signal of decoder 147 to produce data trigger select signal TRSEL.

In the structure shown in FIG. 37, register circuit 145 and decoder 147 are activated in access to a memory unit. When one memory unit is to be successively accessed, select signal generating circuit 148 continuously generates data trigger select signal TRSEL. Register circuit 145 and decoder 147 can prepare for the next access, and can handle even switching between memory units or between memory chips at high speed.

Control circuit 146 accesses register circuit 145 in accordance with address signal AD specifying a memory unit name and a memory chip name. When the strobe information is to be stored in register circuit 145, control circuit 146 enters the write mode to write information, (LA+LB)/2, indicating the strobe timing information into the register circuit in accordance with the address signal.

Figure 38:
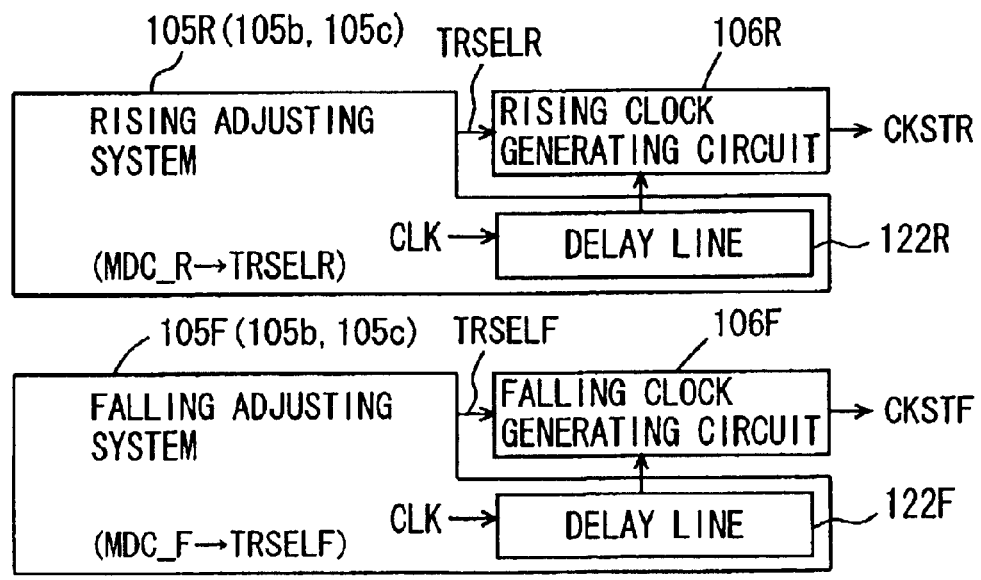
FIG. 38 specifically shows structures of a timing control circuit and a strobe clock generating circuit shown in FIG. 18.

FIG. 38 schematically shows a structure of the clock generating portion. In FIG. 38, the clock generating portion includes a rising clock generating circuit 106R for producing strobe clock signal CKSTR for the data transferred in synchronization with the rising edge of clock signal CLK, a falling clock generating circuit 106F for producing strobe clock signal CKSTF for the data transferred in synchronization with the falling edge of clock signal CLK, rising adjusting circuitry 105R for producing a data trigger select signal TRSELR to rising clock generating circuit 106R, and falling adjusting circuitry 105F for producing a data trigger select signal TRSELF to falling clock generating circuit 106F.

Rising adjusting circuitry 105R includes a circuit portion for producing data trigger select signal TRSELR in accordance with the final valid data window detection signal as described with reference to in FIG. 26 et. seq. Therefore, rising adjusting circuitry 105R includes a delay line 122R for delaying clock signal CLK, and a register circuit (not shown) for detecting the matching portion in delay line 122R and stores the detected position. Likewise, falling adjusting circuitry 105F includes strobe timing detecting circuit 105b, strobe timing storage circuit 105c and delay line 122F delaying clock signal CLK as well as a latch stage and a register circuit (not shown) for detecting and storing the strobe timing in accordance with the delayed clock signal of delay line 122F.

Rising clock generating circuit 106R selects a delayed clock signal transmitted from delay line 122R in accordance with data trigger select signal TRSELR, and produces strobe clock signal CKSTR. Falling clock generating circuit 106F produces strobe clock signal CKSTF by selecting the delayed clock signal of delay line 122F in accordance with data trigger select signal TRSELF.

Figure 39:
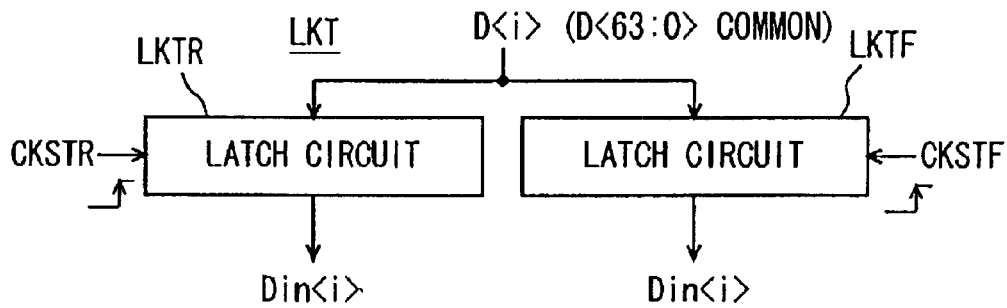
FIG. 39 schematically shows a structure of a latch circuit shown in FIG. 18.

FIG. 39 shows by way of example a structure of latch circuit LKT. In FIG. 39, latch circuit LKT includes a latch circuit LKTR for taking in data bit D<i> transferred from a selected memory chip at the rising edge of strobe clock signal CKSTR, and a latch circuit LKTF for taking in data bit D<i> in synchronization with the rising edge of strobe clock signal CKSTF.

When data is formed of 64 bits D<63:0>, latch circuits LKTR and LKTF are provided for each data bit. Latch circuits LKTR and LKTF perform the latching operation commonly on 64 bits of data D<63:0> in accordance with strobe clock signals CKSTF and CKSTR so that internal data Din<63:0> of 64 bits is produced.

The internal data bits produced by latch circuits LKTR and LKTF may be successively and internally transferred in parallel, in conformity with the internal structure of the control portion of the chip set. Alternatively, these internal data bits may be sequentially transferred via the same internal data bus serially.

Since latch circuit LKT includes latch circuits LKTR and LKTF for respective strobe clock signals CKSTR and CKSTF, the data bits transferred at the rising and falling edges of clock signal CLK, can be sampled (latched) by latch circuits LKTR and LKTF operating at a sow speed.

The sampling timing is determined at the rising edges of strobe clock signals CKSTR and CKSTF. However, by inverting the logic of the strobe clock signal in the foregoing structure, the data sampling in these latch circuits LTK can be adapted to be made in synchronization with the falling of strobe clock signals CKSTR and CKSTF.

[First Modification]

Figure 40:
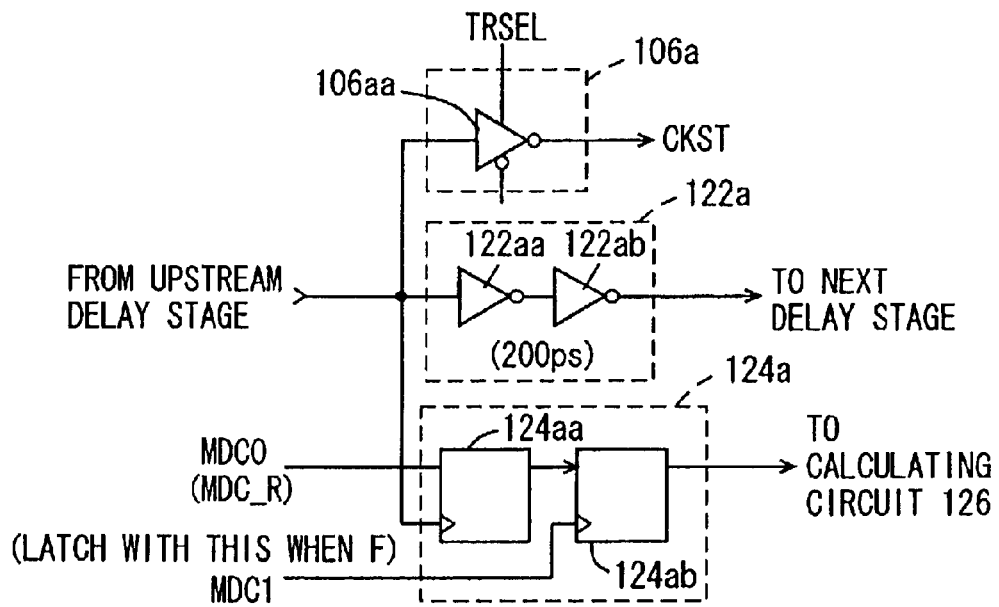
FIG. 40 schematically shows another example of the delay line and the result register shown in FIG. 26.

FIG. 40 shows a structure of a main portion of the strobe timing detecting circuit and the result register circuit according to a modification of the fifth embodiment of the invention. The structure shown in FIG. 40 differs from the structure shown in FIG. 27 in that latch 124aa in register circuit 124a latches applied valid data window detection signal (latch instructing signal) MDC0 (MC_R) at the rising edge of the input clock signal of a corresponding delay stage 122aa. Structures other than the above are the same as those shown in FIG. 27. Corresponding portions are assigned the same reference numerals, and description thereof is not repeated.

In the structure shown in FIG. 40, the valid data window for the data transferred in synchronization with the rising edge of clock signal CLK, is detected. For the data bit transferred in synchronization with the falling edge of clock signal CLK, latch stage 124aa latches final valid data window detection signal MDC_F in response to the falling of the input clock signal of the corresponding delay stage.

Figure 41A:
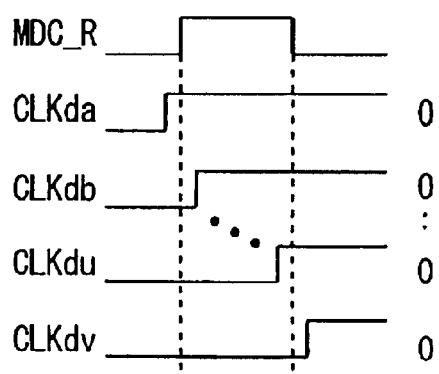
FIGS. 41A and 41B are timing diagrams illustrating an operation of circuits shown in FIG. 40.

In the structure shown in FIG. 40, as illustrated in FIG. 41A, final valid data window detection signal MDC_R is latched at the rising edge of the corresponding delayed clock signal CLKda or the other. Therefore, in the case when final valid data window detection signal MDC_R rises between delayed clock signal CLKda and delayed clock signal CLKdb, and falls between delayed clock signal CLKdu and delayed clock signal CLKdv, "1" is stored in the latch stages corresponding to the region of this valid data window detection signal MDC_R.

Figure 41B:
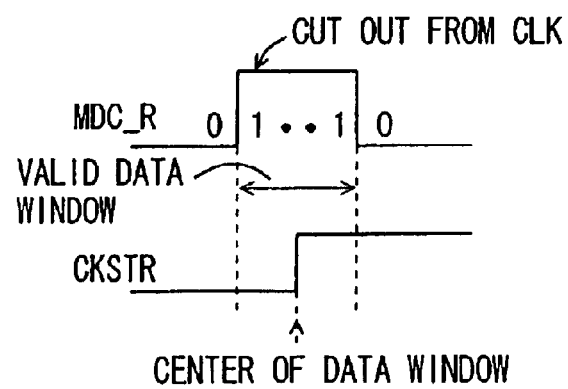

The number of register circuits 124a storing "1" corresponds to the time width of the final valid data window. As shown in FIG. 41B, such a state is achieved that clock signal CLK is cut out with the valid data window. Therefore, the input clock signal of the delay stage, which corresponds to the latch stage at the central position among latch stages 124ab storing "1", is selected as strobe clock signal CKSTR. Accordingly, it becomes possible to produce strobe clock signal CKSTR providing the strobing timing at the center of the valid data window. Even if the valid data windows may different in width for different memory units or memory chips (banks), and may be shorter than half a cycle of clock signal CLK, the set-up time and hold time can be accurately made equal to each other, and it is possible to provide the strobe timing maximizing the margins for these set-up time and hold time.

Figure 42A:
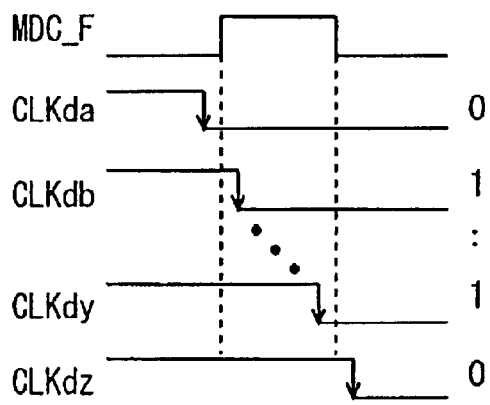
FIGS. 42A and 42B are timing diagrams illustrating an operation of the circuits shown in FIG. 40.
Figure 42B:
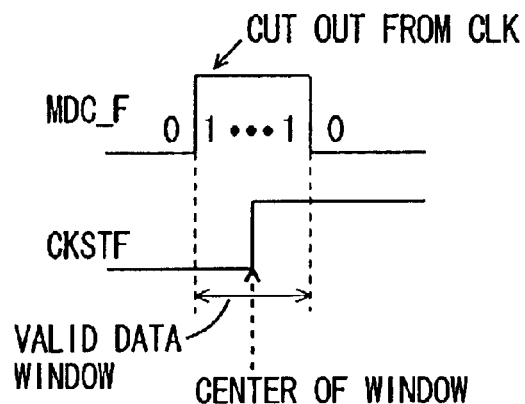

FIG. 42A illustrates an operation of detecting the strobe timing for the data transferred in synchronization with the falling edge of clock signal CLK. As illustrated in FIG. 42A, the latch stages corresponding to the section of the active state of final valid data window detection signal MDC_F store "1". In FIG. 42A, final valid data window detection signal MDC_F rises between rising edges of clock signals CLKda and CLKdb, and falls between falling edges of clock signals CLKdy and CLKdz. In this case, the latch stages receiving delayed clock signals CLKdb and CLKdy store "1", and the other latch stages store "0". Accordingly, strobe clock signal CKSTF providing the strobe timing in the central position of the valid data window can be produced for the data transferred in synchronization with the falling of clock signal CLK.

The delay time on delay line 122 may be sufficient to be equal to one cycle of clock signal CLK. This prevents such a situation that match is detected simultaneously in a plurality of portions.

For structures of the first modification other than the above, it is possible to utilize the structures of the strobe timing detecting circuit and strobe timing storage circuit already described with reference to FIGS. 36 and 37.

[Second Modification]

Figure 43:
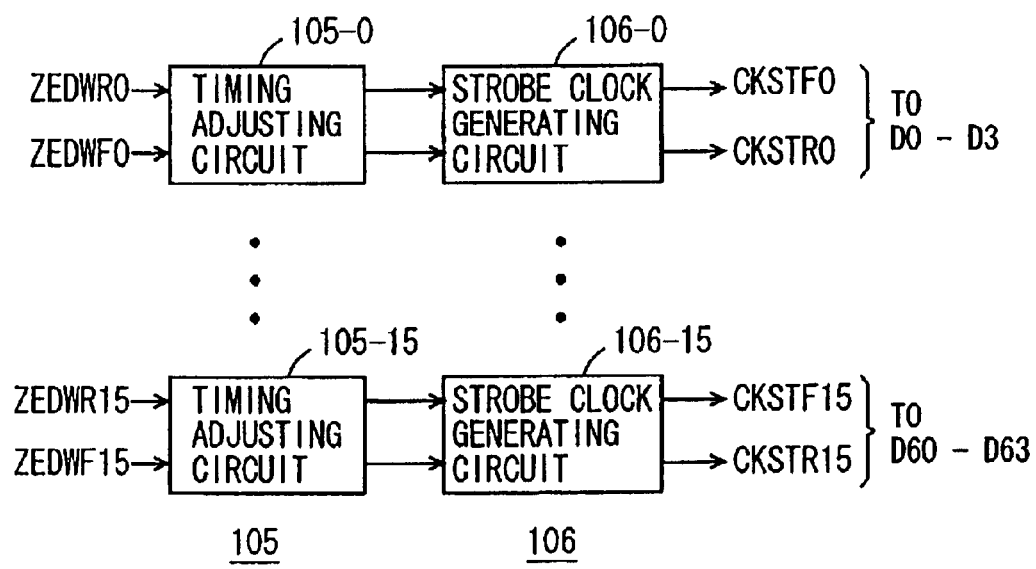
FIG. 43 schematically shows a structure of a modification of the fifth embodiment according to the invention.
Figure 44:
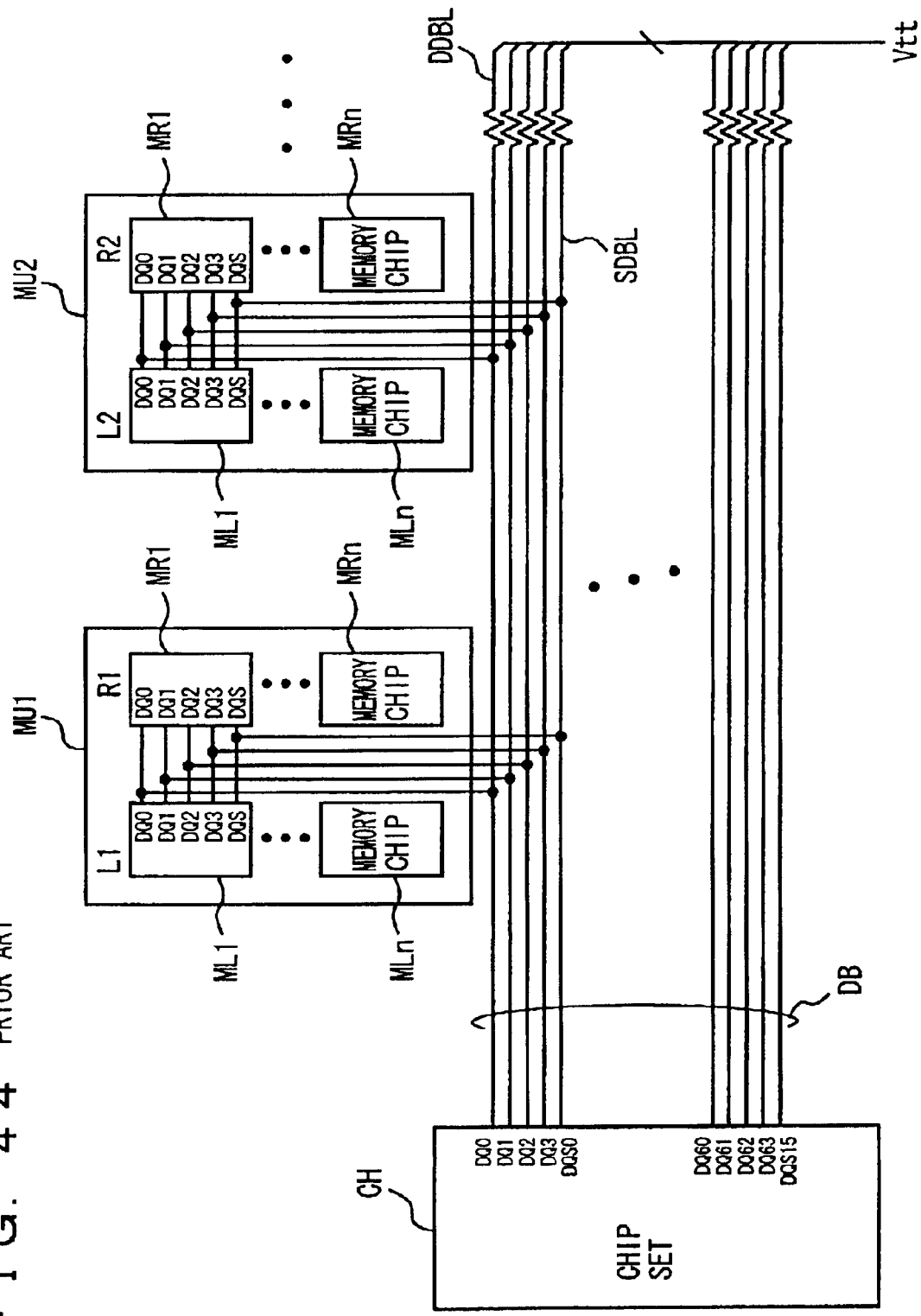
FIG. 44 schematically shows a structure of a conventional memory system.
Figure 45:
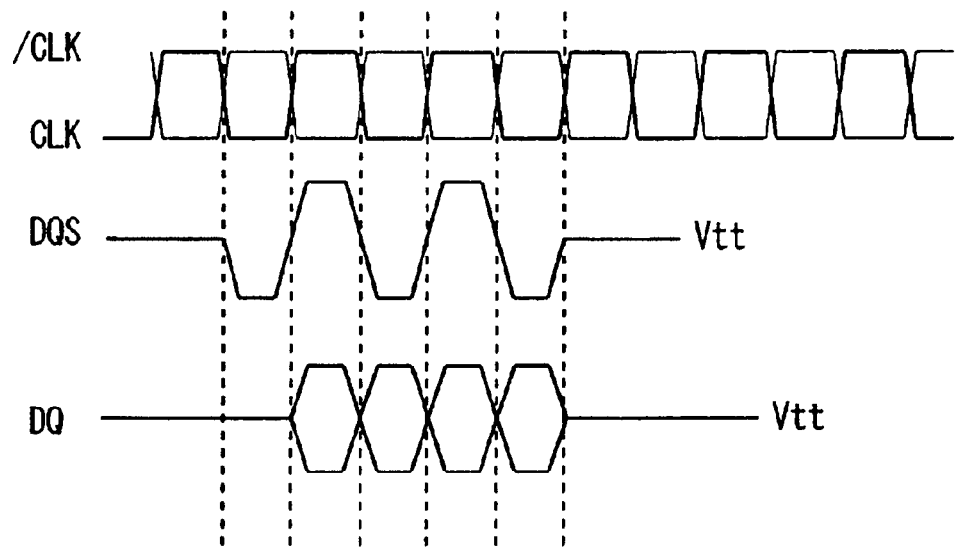
FIG. 45 shows signal waveforms in a data transfer operation of an output system shown in FIG. 44.
Figure 46:
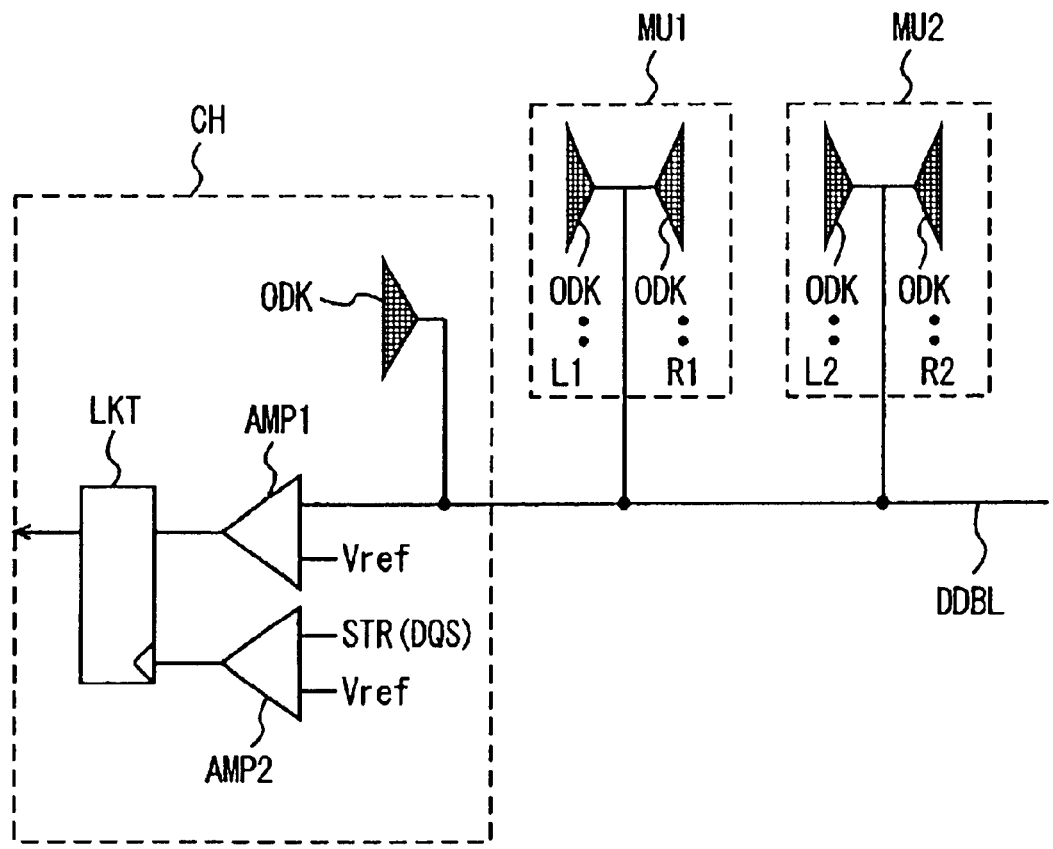
FIG. 46 schematically shows a structure of an interface circuit of a memory system according to a conventional active termination method.

FIG. 43 schematically shows a structure of a second modification of the fifth embodiment of the invention. FIG. 43 shows by way of example a structure for 64 data bits D0–D63. The structure of the second modification likewise adjusts the strobe timing on a four data bit basis. Thus, timing control circuit 105 includes timing adjusting circuits provided for each data of four bits. Timing adjusting circuit 105-0 adjusts relative timing for data bits D0–D3 in accordance with local valid data window detection signals ZEDWR0 and ZEDWF0. Timing adjusting circuit 105-15 adjusts the strobe timing for data bits D60–D63 in accordance with local valid data window detection signals ZEDWR15 and ZEDWF15. In general, timing adjusting circuit 105-i adjusts the strobe timing for data bits D<4i>–D<4i+3> in accordance with local valid data window detection signals ZEDWRi and ZEDWFi.

For timing adjusting circuits 105-0–105-15, strobe clock generating circuits 106-0–106-15 are provided for producing the strobe clock signals, respectively. Strobe clock generating circuit 106-0 produces strobe clock signal CKSTF0 and CKSTR0 for data bits D0–D3. Strobe clock generating circuit 106-15 produces strobe clock signal CKSTF15 and CKSTR15 for data bits D60-D63.

Timing adjusting circuits 105-0–105-15 and strobe clock generating circuits 106-0–106-15 may have structures the same as those already described, except for that local window detection signals ZEDW are used instead of final valid data window detection signals MDC_R and MDC_F. In the structure shown in FIG. 43, the memory unit transfers 4-bit data, and the data can be taken in more accurately by adjusting the strobe timing on a memory unit basis. In this case, the data strobe timing can be adjusted every memory chip in the memory unit.

The adjustment of the strobe timing of the data bits may be performed on a byte basis, or in a two byte unit.

According to the fifth embodiment of the invention, as described above, the valid data window is detected, and the timing of the strobe clock signal is adjusted in accordance with the valid data window thus detected. Therefore, even if signal propagation delay occurs in an on-board assembly, the data can be accurately taken in. Since the memory unit does not transfer data strobe signal DQS, it is possible to reduce the number of signal lines for transferring data strobe signal DQS as well as the power consumption for such signal transfer. The above structure does not require a DLL for performing the phase adjustment when a memory unit transfers the output data in synchronization with clock signal CLK. Therefore, the cost and current consumption of the memory unit can be reduced.

[Other Modification]

In the foregoing memory systems, 64-bit data is transferred, four memory units are arranged for 4-bit data, and each memory unit is formed of a module. However, such a structure may be employed that one memory unit transfers 64-bit data, and one memory unit is selected and accessed. The memory unit may not formed of a memory module, but may include only one memory chip.

The system configuration is not restricted to the memory system formed of the chip set and the memory units. The invention can be applied, as an interface circuit, for various systems provided that the signal/data are transfers in the active termination method in synchronization with a clock signal in the system.

In the system bus structure described above, the write data and read data of the memory unit are transferred commonly through data bus DB. However, a write data bus for transferring the write data may be arranged separately from a read data bus for transferring the read data. If the write and read buses are arranged separately, the output drive circuit as described above is arranged for the read data bus line.

The power supply voltage is used as the termination voltage. However, the ground voltage may be used as the termination voltage. If the ground voltage is used as the termination voltage, the output drive circuit has the same structure as that employed in the first to fourth embodiments, except for that the termination control transistor is formed of an N-channel MOS transistor, and the output drive MOS transistor is formed of a P-channel MOS transistor. The structure of the control circuit may be substantially the same as those described above. except for that the logical levels of the control signals are reversed.

According to the invention, in the memory system having signal/data transferred in accordance with the active termination scheme, the termination voltage is set to a power source voltage (power supply voltage or ground voltage) different from an intermediate voltage, and the data/signal is transferred in the open drain manner. Therefore, the termination resistance for terminating the bus line at the intermediate voltage is not required so that an area occupied by the output drive circuit can be reduced. Further, the present invention requires neither a termination resistance inside the chip nor a transistor for selectively validating the termination so that the sizes of the termination control transistors can be reduced, and the parasitic capacitance of the output node can be reduced. Therefore, the signal/data can be transferred fast with low current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interface circuit for driving an output node in accordance with an internal signal when activated, comprising:

a first transistor for driving said output node to a first voltage level in accordance with said internal signal when said interface circuit is active, and rendered non-conductive when said interface circuit is inactive; and at least one second transistor coupled to said output node, rendered non-conductive when said interface circuit is active and when said first transistor is conductive, and selectively rendered conductive to drive said output node to a second voltage level of a polarity different from a polarity of said first voltage when said interface circuit is inactive, said at least one second transistor including:

(i) a first termination transistor selectively rendered conductive complementarily to said first transistor in accordance with said internal signal when said interface circuit is active, and kept non-conductive when said interface circuit is inactive, and (ii) a second termination transistor rendered non-conductive when said interface circuit is active, and kept conductive when a semiconductor device including said interface circuit is inactive, wherein said interface circuit is arranged in each of a plurality of semiconductor chips arranged in parallel in said semiconductor device, and said second termination transistor has a conductive state and a non-conductive state in inactivation of said interface circuit determined in accordance with at least a module select signal specifying said semiconductor device.

2. An interface circuit for driving an output node in accordance with an internal signal when activated, comprising:

a first transistor for driving said output node to a first voltage level in accordance with said internal signal when said interface circuit is active, and rendered non-conductive when said interface circuit is inactive; and at least one second transistor coupled to said output node, rendered non-conductive when said interface circuit is active and when said first transistor is conductive, and selectively rendered conductive to drive said output node to a second voltage level of a polarity different from a polarity of said first voltage when said interface circuit is inactive, wherein said at least one second transistor includes a plurality of termination transistors commonly coupled to said output node, and said interface circuit further includes a circuit for storing information designating a termination transistor to be operative among said plurality of termination transistors.

3. An interface circuit for producing an internal signal in accordance with a signal applied to an input node, comprising:

a termination transistor coupled to said input node and rendered conductive to drive said input node to a first power supply voltage level independently of a logical level of the signal applied at the input node when the signal is applied to said input node, said input node being driven to a second power supply voltage level different in polarity from said first power supply voltage level in accordance with said signal; and internal signal producing circuitry for producing said internal signal in accordance with the signal applied to said input node.

4. The interface circuit according to claim 3, wherein said internal signal producing circuitry includes:

an input circuit for comparing the signal applied to said input node and a reference voltage to produce a pre-internal signal in accordance with a result of comparison;

a valid window detecting circuit for detecting a transition point in the signal applied to said input node, and producing a valid window signal indicating an valid period in accordance with a result of detection, a valid window width detecting circuit for detecting and storing a time width of the valid window signal detected by said valid window detecting circuit;

a strobe timing detecting circuit for determining and storing strobe timing for said signal in accordance with the time width detected by said valid window width detecting circuit;

a strobe signal producing circuit for producing a strobe signal for said signal at said input node in accordance with the strobe timing stored in said strobe timing detecting circuit; and a latch circuit for latching said pre-internal signal generated from said input circuit in accordance with said strobe signal, to produce said internal signal.

5. The interface circuit according to claim 4, wherein said input node is commonly connected to a plurality of memory devices, and said valid window signal is produced for each of said memory devices, and said strobe signal is produced individually for each of said memory devices.

* * * * *